(12) United States Patent
Lin

(10) Patent No.: US 11,175,695 B2
(45) Date of Patent: Nov. 16, 2021

(54) FOLDABLE MOBILE TERMINAL, FOLDABLE MECHANISM FOR FOLDABLE MOBILE TERMINAL, AND FOLDABLE UNIT FOR FOLDABLE MOBILE TERMINAL

(71) Applicant: GUANGDONG OPPO MOBILE TELECOMMUNICATIONS CORP., LTD., Guangdong (CN)

(72) Inventor: Yugui Lin, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/685,371

(22) Filed: Nov. 15, 2019

(65) Prior Publication Data

US 2020/0081487 A1  Mar. 12, 2020

Related U.S. Application Data

(63) Continuation of application No. PCT/CN2018/086534, filed on May 11, 2018.

(30) Foreign Application Priority Data

May 17, 2017 (CN) .......................... 201710351006.7
May 17, 2017 (CN) .......................... 201720557002.X

(51) Int. Cl.
*G06F 1/16* (2006.01)
*H05K 5/00* (2006.01)
(Continued)

(52) U.S. Cl.
CPC .......... *G06F 1/1616* (2013.01); *G06F 1/1652* (2013.01); *H04M 1/0216* (2013.01);
(Continued)

(58) Field of Classification Search
None
See application file for complete search history.

(56) References Cited

U.S. PATENT DOCUMENTS 5,075,926 A * 12/1991 Jeong ..................... A45C 13/22
                                                          16/429
8,804,324 B2    8/2014 Bohn et al.
(Continued)

FOREIGN PATENT DOCUMENTS

CN    103914273 A    7/2014
CN    104836865 A    8/2015
(Continued)

OTHER PUBLICATIONS

European search report, EP18802101.8, dated Apr. 7, 2020 (9 pages).
(Continued)

*Primary Examiner* — James Wu
*Assistant Examiner* — Christopher L Augustin
(74) *Attorney, Agent, or Firm* — Young Basile Hanlon & MacFarlane, P.C.

(57) ABSTRACT

A foldable mobile terminal and related products include: a flexible display screen; a first housing and a second housing, the flexible display screen being provided on the first housing and the second housing, and the first housing being provided with separate first gaps; and a first rotating assembly and a second rotating assembly both including sliding plates, rotating shafts, and connecting rods. The sliding plates are at least partially received in the housings, and can extend or retract with respect to the housings in a sliding manner. The rotating shafts are provided on the sliding plates. First ends of the connecting rods are slidably and hingedly connected to the rotating shafts, and second ends are rotatably connected to the housings. The sliding plate of
(Continued)

the first rotating assembly is provided with teeth corresponding to the first gaps.

12 Claims, 22 Drawing Sheets

(51) Int. Cl.
    *H05K 5/02*     (2006.01)
    *H04M 1/02*     (2006.01)

(52) U.S. Cl.
    CPC ........ *H04M 1/0268* (2013.01); *H05K 5/0017* (2013.01); *H05K 5/0086* (2013.01); *H05K 5/0226* (2013.01)

(56) References Cited

U.S. PATENT DOCUMENTS

| | | | |
|---|---|---|---|
| 8,971,032 | B2 | 3/2015 | Griffin et al. |
| 9,173,287 | B1 | 10/2015 | Kim et al. |
| 9,179,559 | B1 | 11/2015 | Kim |
| 9,348,450 | B1* | 5/2016 | Kim ................. G06F 3/0412 |
| 9,535,452 | B2 | 1/2017 | Ahn |
| 9,557,771 | B2 | 1/2017 | Park et al. |
| 9,600,035 | B2 | 3/2017 | Park et al. |
| 9,760,126 | B2 | 9/2017 | Shin et al. |
| 9,844,251 | B2 | 12/2017 | Lin et al. |
| 9,848,502 | B1 | 12/2017 | Chu et al. |
| 9,952,631 | B2 | 4/2018 | Xin et al. |
| 10,268,245 | B2 | 4/2019 | Lin |
| 10,296,044 | B2 | 5/2019 | Siddiqui et al. |
| 10,306,783 | B2 | 5/2019 | Seo et al. |
| 10,344,510 | B2 | 7/2019 | Siddiqui et al. |
| 10,364,598 | B2* | 7/2019 | Tazbaz ................. G06F 1/1681 |
| 10,365,691 | B2 | 7/2019 | Bae et al. |
| 10,383,241 | B2 | 8/2019 | Lin |
| 10,394,062 | B1 | 8/2019 | Song |
| 10,433,438 | B2 | 10/2019 | Moon et al. |
| 10,452,097 | B2 | 10/2019 | Lin |
| 10,641,318 | B2 | 5/2020 | Siddiqui |
| 10,716,228 | B2* | 7/2020 | You ................. H05K 5/0226 |
| 2008/0253073 | A1 | 10/2008 | Kee et al. |
| 2010/0043174 | A1 | 2/2010 | Bestle et al. |
| 2010/0075717 | A1 | 3/2010 | Ou |
| 2012/0002360 | A1 | 1/2012 | Seo et al. |
| 2012/0044620 | A1 | 2/2012 | Song et al. |
| 2012/0120618 | A1 | 5/2012 | Bohn |
| 2012/0139815 | A1* | 6/2012 | Aono ................. G06F 1/1677 345/1.3 |
| 2012/0154999 | A1* | 6/2012 | Park ................. H04M 1/0237 361/679.01 |
| 2012/0307472 | A1 | 12/2012 | Bohn et al. |
| 2013/0010405 | A1 | 1/2013 | Rothkopf et al. |
| 2013/0021762 | A1 | 1/2013 | van Dijk et al. |
| 2014/0174226 | A1 | 6/2014 | Hsu et al. |
| 2014/0196254 | A1* | 7/2014 | Song ................. E05D 3/14 16/302 |
| 2014/0213324 | A1 | 7/2014 | Tan et al. |
| 2015/0055287 | A1 | 2/2015 | Seo |
| 2015/0077917 | A1 | 3/2015 | Song |
| 2015/0233162 | A1 | 8/2015 | Lee et al. |
| 2016/0085271 | A1 | 3/2016 | Morrison et al. |
| 2016/0132075 | A1 | 5/2016 | Tazbaz |
| 2016/0302314 | A1* | 10/2016 | Bae ................. G06F 1/16 |
| 2017/0068275 | A1* | 3/2017 | Lee ................. H04M 1/0268 |
| 2017/0192460 | A1* | 7/2017 | Watanabe ................. G09F 9/00 |
| 2017/0303414 | A1 | 10/2017 | Chu |
| 2018/0110139 | A1 | 4/2018 | Seo et al. |
| 2018/0150112 | A1 | 5/2018 | Aoki et al. |
| 2018/0210511 | A1 | 7/2018 | Lin |
| 2019/0179373 | A1* | 6/2019 | Cheng ................. H04M 1/0268 |

FOREIGN PATENT DOCUMENTS

| | | |
|---|---|---|
| CN | 104898784 A | 9/2015 |
| CN | 205281987 U | 6/2016 |
| CN | 105812509 A | 7/2016 |
| CN | 105872136 A | 8/2016 |
| CN | 205451695 U | 8/2016 |
| CN | 205847346 U | 12/2016 |
| CN | 106328007 A | 1/2017 |
| CN | 106559531 A | 4/2017 |
| CN | 106601130 A | 4/2017 |
| CN | 106603773 A | 4/2017 |
| CN | 206100081 U | 4/2017 |
| CN | 206993161 U | 2/2018 |
| CN | 207010739 U | 2/2018 |
| CN | 207010740 U | 2/2018 |
| CN | 207010741 U | 2/2018 |
| CN | 207010742 U | 2/2018 |
| CN | 207022053 U | 2/2018 |
| CN | 207117710 U | 3/2018 |
| CN | 207117712 U | 3/2018 |
| CN | 207321314 U | 5/2018 |
| EP | 2762993 A2 | 8/2014 |
| EP | 3467325 A1 | 4/2019 |
| JP | 2015043078 A | 3/2015 |
| JP | 2016133807 A | 7/2016 |
| KR | 20160144299 A | 12/2016 |
| WO | 2016208857 A1 | 12/2016 |
| WO | 2017003415 A1 | 1/2017 |

OTHER PUBLICATIONS

European search report, EP18802008.5, dated Apr. 24, 2020 (8 pages).
European search report, EP18801532.5, dated Apr. 24, 2020 (9 pages).
European search report, EP18803145.4, dated Apr. 30, 2020 (11 pages).
European search report, EP18801806.3, dated Apr. 30, 2020 (10 pages).
European search report, EP18802318.8, dated Apr. 30, 2020 (9 pages).
International search report,PCT/CN2018/086595, dated Aug. 2, 2018 (2 pages).
International search report,PCT/CN2018/086487, dated Aug. 1, 2018 (2 pages).
International search report,PCT/CN2018/086525, dated Aug. 1, 2018 (3 pages).
International search report,PCT/CN2018/086582, dated Aug. 8, 2018 (2 pages).
International search report,PCT/CN2018/086554, dated Jul. 20, 2018 (2 pages).
International search report issued in corresponding international application No. PCT/CN2018/086534, dated Aug. 31, 2018 (2 pages).
English translation of the Decision to Grant a Patent for JP Application 2019-563230, dated Sep. 11, 2020 (5 pages).
English translation of the Patent rejection from Intellectual Property Office Telecommunication Technology Application 10-2019-7035322, dated Jul. 30, 2020 (8 pages).
Non Final Action from United States Patent and Trademark Office in a counterpart U.S. Appl. No. 16/685,245, dated Aug. 19, 2020 (40 pages).
Notice of Allowance from United States Patent and Trademark Office in a counterpart U.S. Appl. No. 16/685,365, dated Jul. 31, 2020 (25 pages).
Non Final Action from United States Patent and Trademark Office in a counterpart U.S. Appl. No. 16/685,256, dated Aug. 24, 2020 (26 pages).
Non Final Action from United States Patent and Trademark Office in a counterpart U.S. Appl. No. 16/685,252, dated Sep. 1, 2020 (33 pages).
Non Final Action from United States Patent and Trademark Office in a counterpart U.S. Appl. No. 16/685,379, dated Aug. 21, 2020 (19 pages).

(56) References Cited

OTHER PUBLICATIONS

Indian First Examination Report for IN Application 201917051901 dated Mar. 15, 2021. (6 pages).
Indian First Examination Report for IN Application 201917050666 dated Mar. 11, 2021. (5 pages).
Indian First Examination Report for IN Application 201917051094 dated Mar. 18, 2021. (6 pages).
Korean Notice of Allowance for KR Application 10-2019-7035322 dated Feb. 23, 2021. (3 pages).
Notice of Allowance for U.S. Appl. No. 16/685,256 dated Feb. 18, 2021. (9 pages).
Notice of Allowance for U.S. Appl. No. 16/685,252 dated Apr. 5, 2021. (15 pages).
Indian First Examination Report for IN Application 201917050854 dated Apr. 23, 2021. (5 pages).
Notice of Allowance for U.S. Appl. No. 16/685,379 dated Apr. 19, 2021. (11 pages).
Final Office Action for U.S. Appl. No. 16/685,379 dated Mar. 11, 2021. (17 pages).
European examination report for European application No. 18801806.3 dated Mar. 12, 2020 (9 pages).
Final Office Action for U.S. Appl. No. 16/685,252, dated Jan. 21, 2021 (23 pages).
Indian First Examination Report for Indian application No. 201917050991 dated Jan. 1, 2021 (6 pages).
Indian First Examination Report for Indian application No. 201917050824 dated Feb. 2, 2021 (4 pages).
Final Office Action for U.S. Appl. No. 16/685,245 dated Mar. 2, 2021 (34 pages).

* cited by examiner

FOLDABLE MOBILE TERMINAL, FOLDABLE MECHANISM FOR FOLDABLE MOBILE TERMINAL, AND FOLDABLE UNIT FOR FOLDABLE MOBILE TERMINAL

CROSS-REFERENCE TO RELATED APPLICATION(S)

The present application is a continuation application of International (PCT) Patent Application No. PCT/CN2018/086534, filed on May 11, 2018, which claims foreign priorities to Chinese Patent Application No. 201720557002.X, filed on May 17, 2017, and Chinese Patent Application No. 201710351006.7, filed on May 17, 2017, the entire contents of all of which are hereby incorporated by reference in their entireties.

TECHNICAL FIELD

The present disclosure relates to the field of electronic devices, and in particular to a foldable mobile terminal, a foldable mechanism for a foldable mobile terminal, and a foldable unit for a foldable mobile terminal.

BACKGROUND

A flexible display screen may have a property of being foldable. Therefore, a smart mobile terminal, such as a smart phone, which carries a flexible display screen may be transformed between a folded state and an unfolded state. When the mobile terminal is in the unfolded state, a length of a side of the mobile terminal facing towards a user may be equal to a length of another side of the mobile terminal facing away from the user. However, when the mobile terminal is in the folded state, the two sides of the mobile terminal which have an equal length while the mobile terminal is unfolded may have different lengths because of a thickness of the mobile terminal. Therefore, the mobile terminal may need to adapt to a change of the length of the two sides in different states. Besides, it may be unfavorable for the flexible display screen to be stably supported.

SUMMARY

A foldable mobile terminal may include: a flexible display screen; a shell assembly, including a first shell and a second shell, wherein the flexible display screen is arranged on the first shell and the second shell, and the first shell has two or more first notches spaced apart from each other; a first rotation assembly; and a second rotation assembly. The first rotation assembly includes: a first sliding plate, at least partially received in the first shell and able to slide towards or away from the first shell, wherein two or more first latches are arranged on the first sliding plate and correspond to the two or more first notches; a first rotation shaft, arranged on the first sliding plate; and a first connection rod, wherein a first end of the first connection rod is slidably hinged to the first rotation shaft, and a second end of the first connection rod is rotatably connected to the first shell. The second rotation assembly includes: a second sliding plate, at least partially received in the second shell and able to slide towards or away from the second shell; a second rotation shaft, arranged on the second sliding plate; and a second connection rod, wherein a first end of the second connection rod is slidably hinged to the second rotation shaft, and a second end of the second connection rod is rotatably connected to the second shell.

A foldable mechanism for a foldable mobile terminal may be provided. The mobile terminal includes a first shell and a second shell connected to each other. The foldable mechanism includes: a first rotation assembly and a second rotation assembly. The first rotation assembly includes: a first sliding plate, capable of being at least partially received in the first shell and able to slide towards or away from the first shell, wherein two or more first latches are arranged on the first sliding plate and correspond to the two or more first notches; a first rotation shaft, arranged on the first sliding plate; and a first connection rod, wherein a first end of the first connection rod is slidably hinged to the first rotation shaft, and a second end of the first connection rod is capable of being rotatably connected to the first shell. The second rotation assembly includes: a second sliding plate, capable of being at least partially received in the second shell and able to slide towards or away from the second shell; a second rotation shaft, arranged on the second sliding plate; and a second connection rod, wherein a first end of the second connection rod is slidably hinged to the second rotation shaft, and a second end of the second connection rod is capable of being rotatably connected to the second shell.

A foldable unit for a foldable mobile terminal may be provided and include: a first shell and a second shell, where in the first shell has two or more first notches spaced apart from each other; and a foldable mechanism, connected to the first shell and the second shell. The foldable mechanism includes: a first sliding plate, at least partially received in the first front shell and able to slide towards or away from the first shell, wherein two or more first latches are arranged on the first sliding plate and correspond to the two or more first notches; a first rotation shaft, arranged on the first sliding plate; a first connection rod, wherein a first end of the first connection rod is slidably hinged to the first rotation shaft, and a second end of the first connection rod is rotatably connected to the first shell; a second sliding plate, at least partially received in the second shell and able to slide towards or away from the second shell; a second rotation shaft, arranged on the second sliding plate; and a second connection rod, wherein a first end of the second connection rod is slidably hinged to the second rotation shaft, and a second end of the second connection rod is rotatably connected to the second shell.

DETAILED DESCRIPTION

Figure 1:
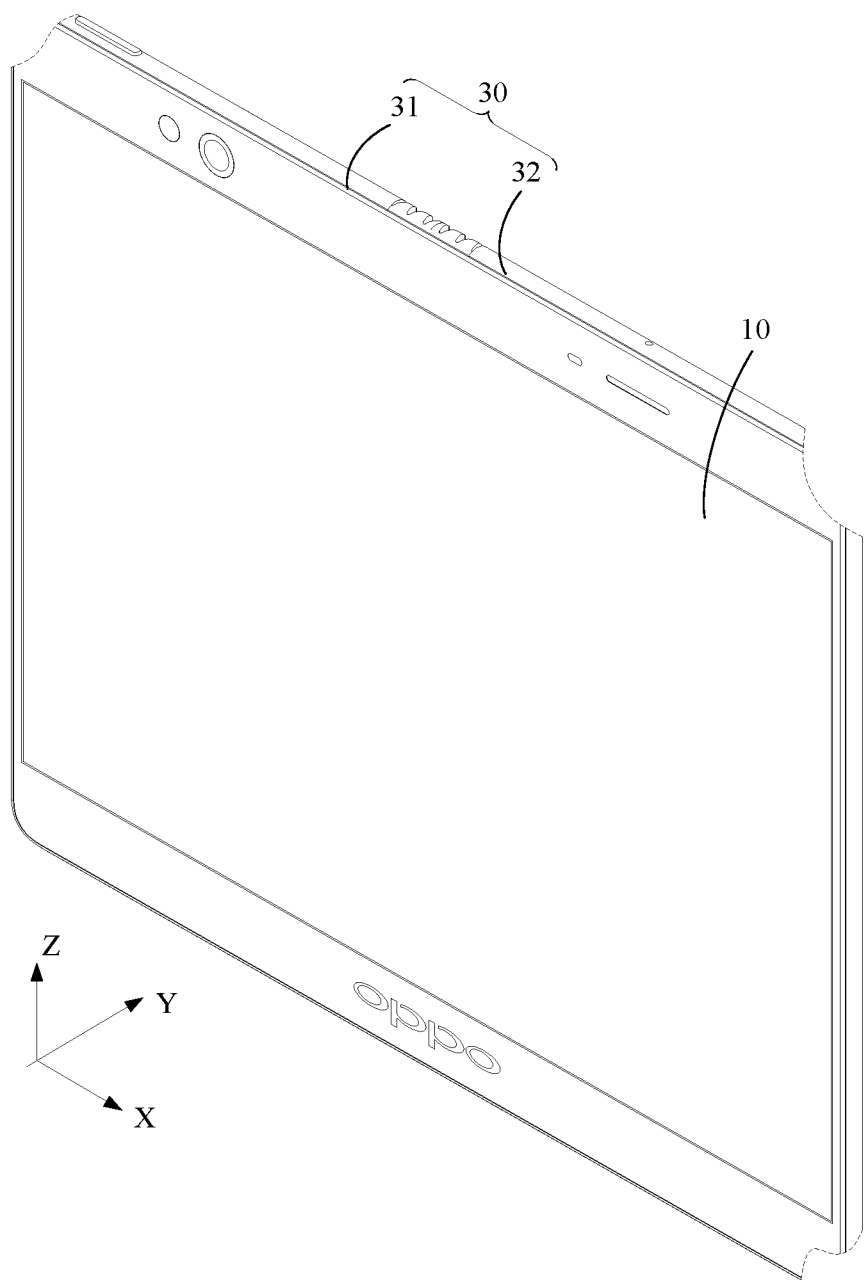
FIG. 1 is a perspective view of a foldable mobile terminal in an unfolded state according to some embodiments of the present disclosure.

Reference will now be made in detail to embodiments of the present disclosure, examples of which are illustrated in the accompanying drawings, in which the same or similar reference numbers throughout the drawings represent the same or similar elements or elements having same or similar functions. Embodiments described below with reference to drawings are merely examples and used for explaining the present disclosure, and should not be understood as limitation to the present disclosure.

The directional terms used here are only for better and more clearly describing and understanding the present disclosure, and are not intended to indicate or imply that the devices or the elements are disposed to locate at the specific directions or are structured and performed in the specific directions, which could not to be understood as limiting the present disclosure. In addition, terms such as "first", "second", and the like are used herein for purposes of description, and are not intended to indicate or imply relative importance or significance or to imply the number of indicated technical features. Thus, the feature defined with "first", "second", and the like may include one or more of such a feature. In the present disclosure, a plurality may indicate two or more, unless specified otherwise.

The mobile terminal provided in the present disclosure may include, but not be limited to, a device receiving/transmitting communication signals by wired connection (such as a public switched telephone network (PSTN), a digital subscriber line (DSL), a digital cable, a direct cable connection, and/or another data connection/network), and/or by a wireless interface (such as a wireless interface of a cellular network, a wireless local area network (WLAN), a digital television network such as a DVB-H network, a satellite network, an AM-FM broadcast transmitter, and/or another communication terminal). A communication terminal configured to communicate by a wireless interface may be referred as a "wireless communication terminal", a "wireless terminal", and/or a "mobile terminal". The mobile terminal of the present disclosure may include, but may be not limited to a satellite or cellular radiotelephone telephone, a terminal of personal communications system (PCS) that may combine cellular radiotelephone with data processing, fax, and data communication capabilities, a personal digital assistant (PDA) equipped with a radiotelephone, a pager, an internet/intranet access, a web browser, a notepad, a calendar, and/or a global positioning system (GPS) receiver, a conventional laptop and/or a palm receiver, other electronic device including a radiotelephone transceiver and the like.

According to an aspect of the present disclosure, a foldable mobile terminal may include: a flexible display screen; a shell assembly, including a first shell and a second shell, wherein the flexible display screen is arranged on the first shell and the second shell, and the first shell has two or more first notches spaced apart from each other; a first rotation assembly; and a second rotation assembly. The first rotation assembly includes: a first sliding plate, at least partially received in the first shell and able to slide towards or away from the first shell, wherein two or more first latches are arranged on the first sliding plate and correspond to the two or more first notches; a first rotation shaft, arranged on the first sliding plate; and a first connection rod, wherein a first end of the first connection rod is slidably hinged to the first rotation shaft, and a second end of the first connection rod is rotatably connected to the first shell. The second rotation assembly includes: a second sliding plate, at least partially received in the second shell and able to slide towards or away from the second shell; a second rotation shaft, arranged on the second sliding plate; and a second connection rod, wherein a first end of the second connection rod is slidably hinged to the second rotation shaft, and a second end of the second connection rod is rotatably connected to the second shell.

In some embodiments, the second shell has two or more second notches spaced apart from each other; the second sliding plate is arranged with two or more second latches; and the two or more second latches correspond to the two or more second notches.

In some embodiments, the first sliding plate includes a first substrate, the two or more first latches are arranged on the first substrate; and the second sliding plate includes a second substrate, and the two or more second latches are arranged on the second substrate.

In some embodiments, the first shell includes a first front shell and a first back shell engaged with each other; the second shell includes a second front shell and a second back shell engaged with each other; the flexible display screen is arranged on the first front shell and the second front shell; the two or more first notches are formed in the first front shell, the two or more second notches are formed in the second front shell; and the first substrate is arranged between the first front shell and the first back shell, and the second substrate is arranged between the second front shell and the second back shell.

In some embodiments, a first pressing sheet is further included. The first pressing sheet is connected to the first front shell, and the first pressing sheet is configured to limit the first connection rod to be disposed between the first pressing sheet and the first front shell.

In some embodiments, a second pressing sheet is further included. The second pressing sheet is connected to the second front shell, and the second pressing sheet is configured to limit the second connection rod to be disposed between the second pressing sheet and the second front shell.

In some embodiments, a supportive strip is further included. A gap is formed between the two or more first latches and the two or more second latches, and at least a part of the supportive strip is received in the gap.

In some embodiments, ends of the two or more first latches away from the first shell are connected to each other to form a first supportive beam; ends of the two or more second latches away from the second shell are connected to each other to form a second supportive beam; and at least a part of the supportive strip is disposed on the first supportive beam and the second supportive beam.

In some embodiments, the first rotation assembly further includes a first sliding member, the first sliding member slidably sleeves on the first rotation shaft, and the first end of the first connection rod is rotatably connected to the first sliding member. The second rotation assembly further includes a second sliding member, the second sliding member slidably sleeves on the second rotation shaft, and the first end of the second connection rod is rotatably connected to the second sliding member.

In some embodiments, the first rotation assembly further includes a first support, and the second rotation assembly further includes a second support. The first support is fixedly connected to the first sliding plate, the first rotation shaft is arranged to extend through the first support, and the first sliding member is arranged between the first support and the first sliding plate. The second support is fixedly connected to the second sliding plate, the second rotation shaft is arranged to extend through the second support, and the second sliding member is arranged between the second support and the second sliding plate.

In some embodiments, a linkage element is further included to move jointly with the first and the second sliding members. The linkage element has a first through hole and a second through hole, the first rotation shaft is arranged to extend through the first through hole, and the second rotation shaft is arranged to extend through the second through hole.

According to another aspect of the present disclosure, a foldable mechanism for a foldable mobile terminal may be provided. The mobile terminal includes a first shell and a second shell connected to each other. The foldable mechanism includes: a first rotation assembly and a second rotation assembly. The first rotation assembly includes: a first sliding plate, capable of being at least partially received in the first shell and able to slide towards or away from the first shell, wherein two or more first latches are arranged on the first sliding plate and correspond to the two or more first notches; a first rotation shaft, arranged on the first sliding plate; and a first connection rod, wherein a first end of the first connection rod is slidably hinged to the first rotation shaft, and a second end of the first connection rod is capable of being rotatably connected to the first shell. The second rotation assembly includes: a second sliding plate, capable of being at least partially received in the second shell and able to slide towards or away from the second shell; a second rotation shaft, arranged on the second sliding plate; and a second connection rod, wherein a first end of the second connection rod is slidably hinged to the second rotation shaft, and a second end of the second connection rod is capable of being rotatably connected to the second shell.

In some embodiments, the second shell has two or more second notches spaced apart from each other; the second sliding plate is arranged with two or more second latches; and the two or more second latches are capable of being arranged to correspond to the two or more second notches.

In some embodiments, the first sliding plate includes a first substrate, the two or more first latches are arranged on the first substrate; and the second sliding plate includes a second substrate, and the two or more second latches are arranged on the second substrate.

In some embodiments, the first shell includes a first front shell and a first back shell engaged with each other; the second shell includes a second front shell and a second back shell engaged with each other; the flexible display screen is are capable of being arranged on the first front shell and the second front shell; the two or more first notches are formed in the first front shell, the two or more second notches are formed in the second front shell; and the first substrate is capable of being arranged between the first front shell and the first back shell, and the second substrate is capable of being arranged between the second front shell and the second back shell.

In some embodiments, a supportive strip is further included. A gap is formed between the two or more first latches and the two or more second latches, and at least a part of the supportive strip is received in the gap.

In some embodiments, ends of the two or more first latches away from the first shell are connected to each other to form a first supportive beam; ends of the two or more second latches away from the second shell are connected to each other to form a second supportive beam; and at least a part of the supportive strip is disposed on the first supportive beam and the second supportive beam.

According to still another aspect of the present disclosure, a foldable unit for a foldable mobile terminal may be provided and include: a first shell and a second shell, wherein the first shell has two or more first notches spaced apart from each other; and a foldable mechanism, connected to the first shell and the second shell. The foldable mechanism includes: a first sliding plate, at least partially received in the first front shell and able to slide towards or away from the first shell, wherein two or more first latches are arranged on the first sliding plate and correspond to the two or more first notches; a first rotation shaft, arranged on the first sliding plate; a first connection rod, wherein a first end of the first connection rod is slidably hinged to the first rotation shaft, and a second end of the first connection rod is rotatably connected to the first shell; a second sliding plate, at least partially received in the second shell and able to slide towards or away from the second shell; a second rotation shaft, arranged on the second sliding plate; and a second connection rod, wherein a first end of the second connection rod is slidably hinged to the second rotation shaft, and a second end of the second connection rod is rotatably connected to the second shell.

In some embodiments, the second shell has two or more second notches spaced apart from each other; the second sliding plate is arranged with two or more second latches; and the two or more second latches correspond to the two or more second notches.

In some embodiments, the first sliding plate includes a first substrate, the two or more first latches are arranged on the first substrate; and the second sliding plate includes a second substrate, and the two or more second latches are arranged on the second substrate.

Figure 19:
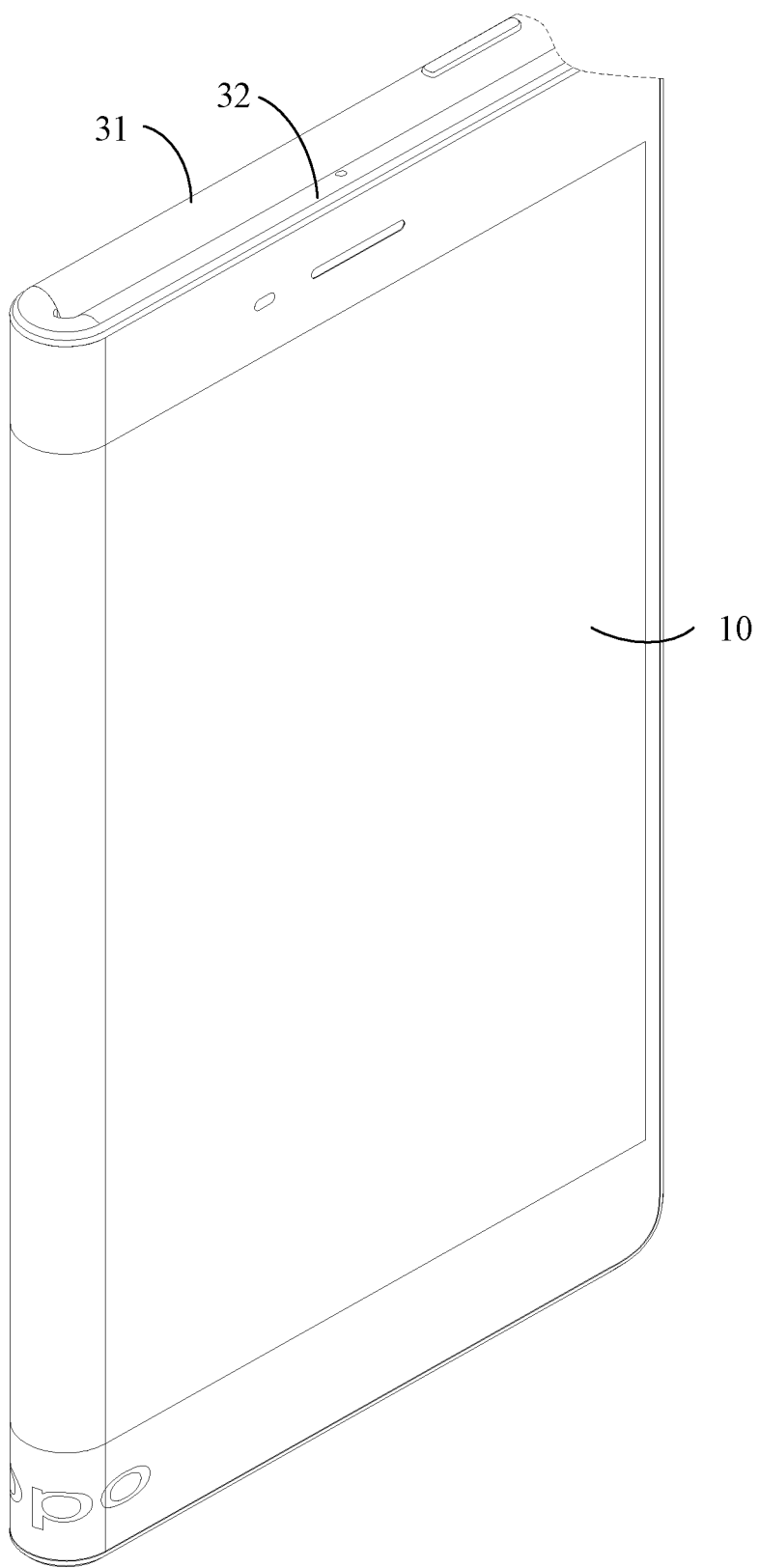
FIG. 19 is a perspective view of a foldable mobile terminal in a folded state according to some embodiments of the present disclosure.
Figure 20:
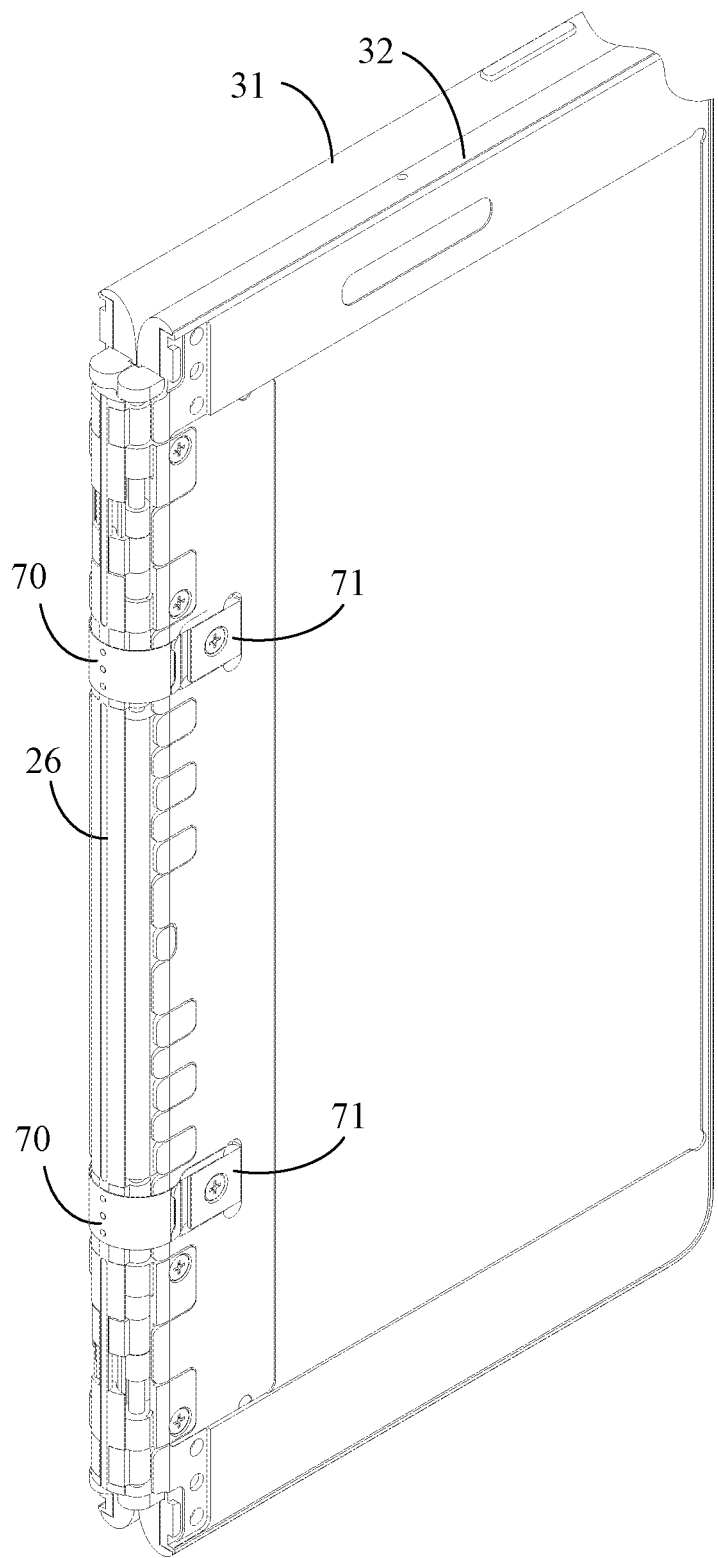
FIG. 20 is a perspective view of the foldable mobile terminal shown in FIG. 19 with a flexible display screen omitted.
Figure 21:
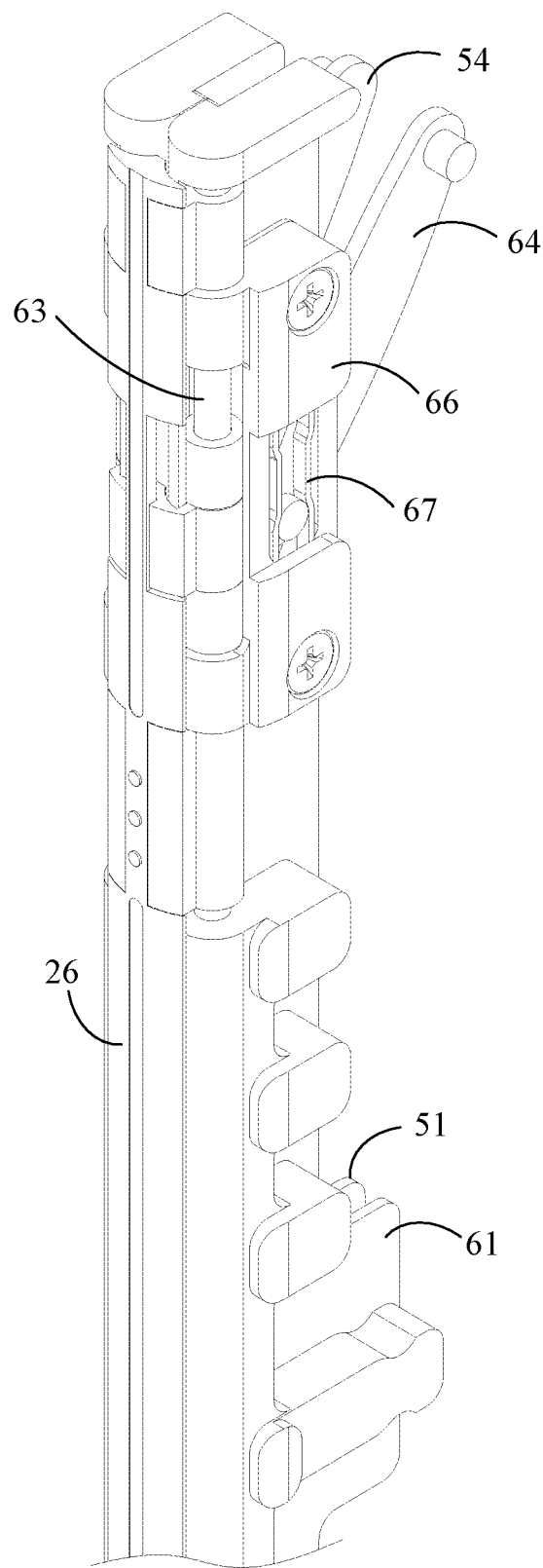
FIG. 21 a perspective view of the foldable mobile terminal shown in FIG. 4 in an unfolded state.

As shown in FIG. 1, FIG. 2, FIG. 3, and FIG. 4, according to some embodiments of the present disclosure, a foldable mobile terminal may be provided. The foldable mobile terminal may include a flexible display screen 10, a foldable mechanism 20, and a shell assembly 30. The shell assembly 30 may include a first shell 31 and a second shell 32. The foldable mechanism 20 may be connected between the first shell 31 and the second shell 32. The flexible display screen 10 may be arranged on the first shell 31 and the second shell 32. The foldable mobile terminal shown in FIG. 1 may be in an unfolded state, and the first shell 31 and the second shell 32 may be symmetric to each other with respect to the foldable mechanism 20. As shown in FIG. 19, when the first shell 31 and the second shell 32 rotates to reach a completely folded state with respect to the foldable mechanism 20, the flexible display screen 10 may be arranged at an outside of the mobile terminal. As shown in FIG. 1, in the unfolded state, an extending length of a side of the shell assembly 30 facing towards the flexible display screen 10 (the length along a direction parallel to an X-axis shown in FIG. 1) may be substantially equal to an extending length of a side of the shell assembly 30 facing away from the flexible display screen 10 (the length along the direction parallel to the X-axis shown in FIG. 1). However, as shown in FIG. 19, the shell assembly 30 itself may have a thickness (the thickness is along a direction parallel to an Y-axis shown in FIG. 1), in a folded state, the extending length of the side of the shell assembly 30 facing towards the flexible display screen 10 may be greater than the extending length of the side of the shell assembly 30 facing away from the flexible display screen 10. By providing the foldable mechanism 20, the first shell 31 and the second shell 32 may adapt to a length difference generated while switching between the folded state and the unfolded state.

The first shell 31 may include a first front shell 311 and a first back shell 312 connected to each other. The second shell 32 may include a second front shell 321 and a second back shell 322 connected to each other. The connection may be achieved by screwing, adhesion, welding, and the like. The flexible display screen 10 may be disposed on the first front shell 311 and the second front shell 321. The flexible display screen 10 may have a display region, and the display region may be rectangular or rounded rectangular in the unfolded state. A space may be formed between the first front shell 311 and the first back shell 312 along the direction parallel to the Y-axis. Similarly, a space may be formed between the second front shell 321 and the second back shell 322 along the direction parallel to the Y-axis. The spaces may allow arrangement of a power module, a communication module, and other components. The spaces may further allow the foldable mechanism 20 to slidably extend and retract with respect to the first shell 31 and the second shell 32; that is to say, the foldable mechanism 20 is slidable away from or towards the first shell 31 and the second shell 32.

Figure 4:
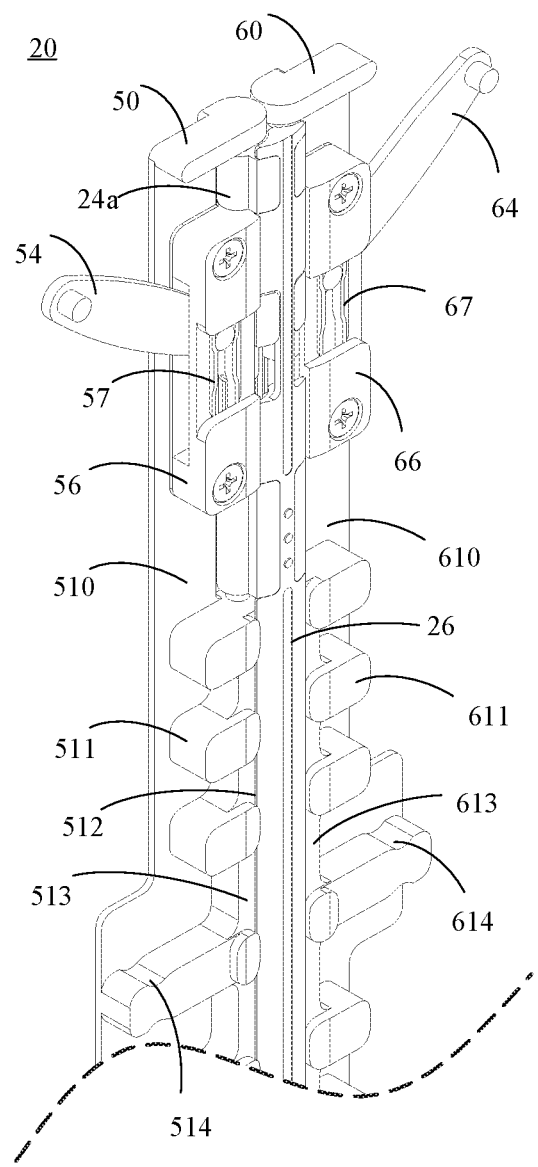
FIG. 4 is a perspective view of a foldable mechanism in a foldable mobile terminal in an unfolded state according to some embodiments of the present disclosure.
Figure 5:
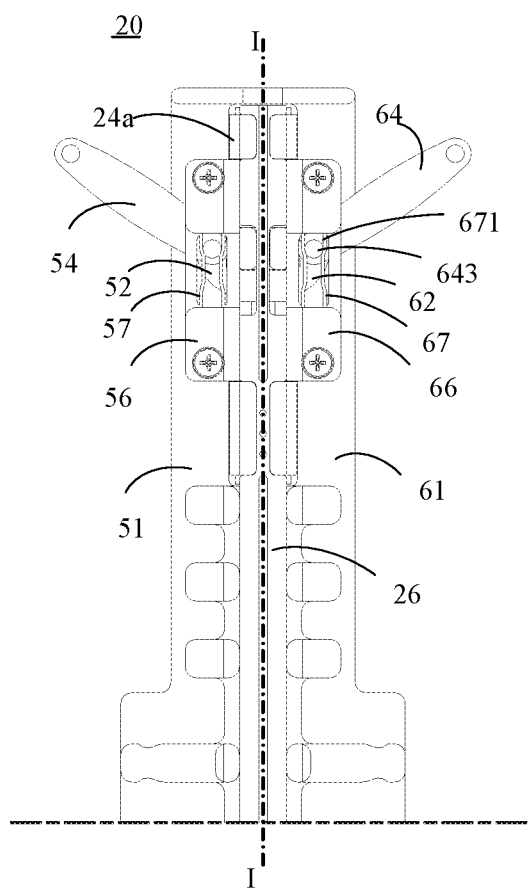
FIG. 5 is a front view of the foldable mechanism shown in FIG. 4.

Another space may be formed between the first shell 31 and the second shell 32 along the direction parallel to the X-axis. The foldable mechanism may be arranged within the space between the first shell 31 and the second shell 32 along the direction parallel to the X-axis, and at least a partial structure of the foldable mechanism 20 may be received in the first shell 31 and the second shell 32. The space between the first shell 31 and the second shell 32 along the direction parallel to the X-axis may be changed during the rotation of the first shell 31 and the second shell around the foldable mechanism 20. Therefore, during the rotation of the first shell 31 and the second shell 32 around the foldable mechanism 20, the foldable mechanism 20 may be retracted into the first shell 31 and the second shell 32 at varying levels. As shown in FIG. 4 and FIG. 5, the foldable mechanism 20 may include a first rotation assembly 50 and a second rotation assembly 60. The first rotation assembly 50 may be connected to the first shell 31. The first rotation assembly 50 may be at least partially received inside the first shell 31, and may slidably extend and retract with respect to (i.e., slide away from or towards) the first shell 31. The second rotation assembly 60 may be connected to the second shell 32. The second rotation assembly 60 may be at least partially received inside second shell 32, and may slidably extend and retract with respect to (slide away from or towards) the second shell 32. By the slidable extension and retraction of the first rotation assembly 50 with respect to the first shell 31 and the slidable extension and retraction of the second rotation assembly 60 with respect to the second shell 32, the first shell 31 and the second shell 32 may adapt to a length difference generated while switching between the folded state and the unfolded state.

In some embodiments, the first rotation assembly 50 and the second rotation assembly 60 may have a same structure. The first rotation assembly 50 and the second rotation assembly 60 may be symmetrically distributed about a central axis I-I (shown in FIG. 5) between the first rotation assembly 50 and the second rotation assembly 60. By arranging the first rotation assembly 50 and the second rotation assembly 60 to be symmetric to each other, the first shell 31 and the second shell 32 may be folded and unfolded symmetrically about the central axis I-I.

As further shown in FIG. 4, FIG. 5, FIG. 6, and FIG. 7, the first rotation assembly 50 may include a first sliding plate 51, a first rotation shaft 53, and a first connection rod 54. The first rotation shaft 53 may be arranged on the first sliding plate 51. A first end 541 of the first connection rod 54 may be slidably hinged to the first rotation shaft 53, and a second end 542 of the first connection rod 54 may be rotatably connected to the first shell 31. The first sliding plate 51 may be at least partially received in the first shell 31, and slidably extend and retract with respect to (i.e., slide away from or towards) the first shell 31. While the first shell 31 and the second shell 32 folds and unfolds symmetrically, the first sliding plate 51 together with the first rotation shaft 53 may slidably extend and retract with respect to (i.e., slide away from or towards) the first shell 31. The second end 542 of the first connection rod 54 may rotate with respect to the first shell 31. The first end 541 of the first connection rod 54 may slide on the first rotation shaft 53 and rotate with respect to the first rotation shaft 53. By changing a level at which the first sliding plate 51 is received inside the first shell 31, it is possible to adapt to a length difference generated during the folding and unfolding of the first shell 31 and the second shell 32.

Figure 2:
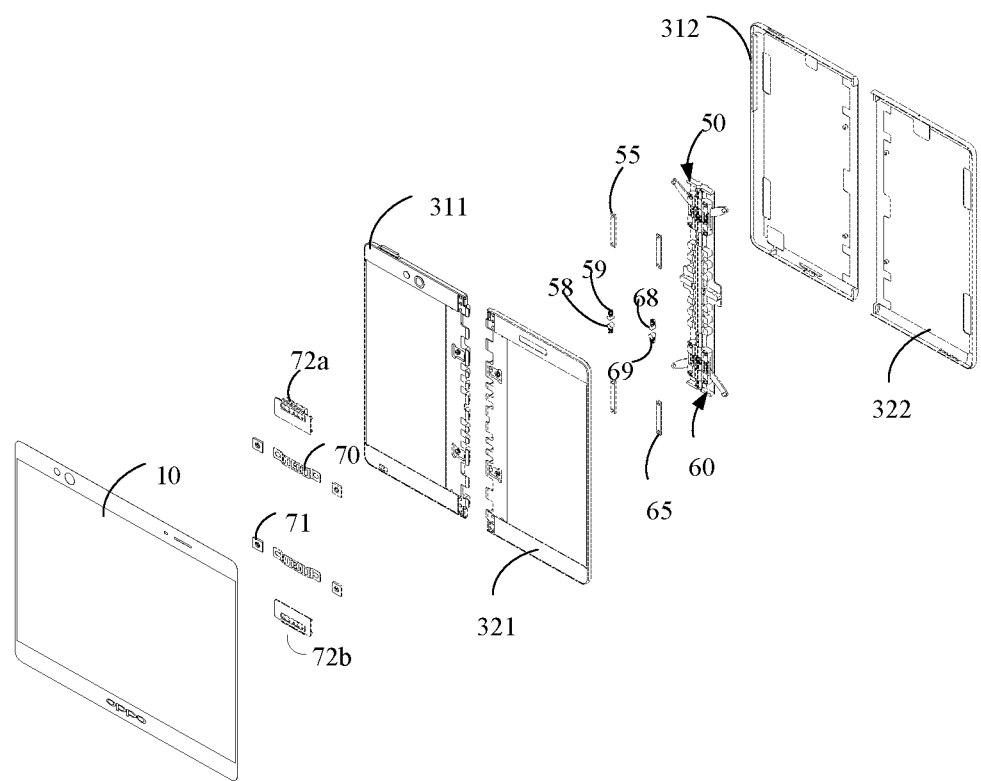
FIG. 2 is an exploded perspective view of the foldable mobile terminal shown in FIG. 1.
Figure 3:
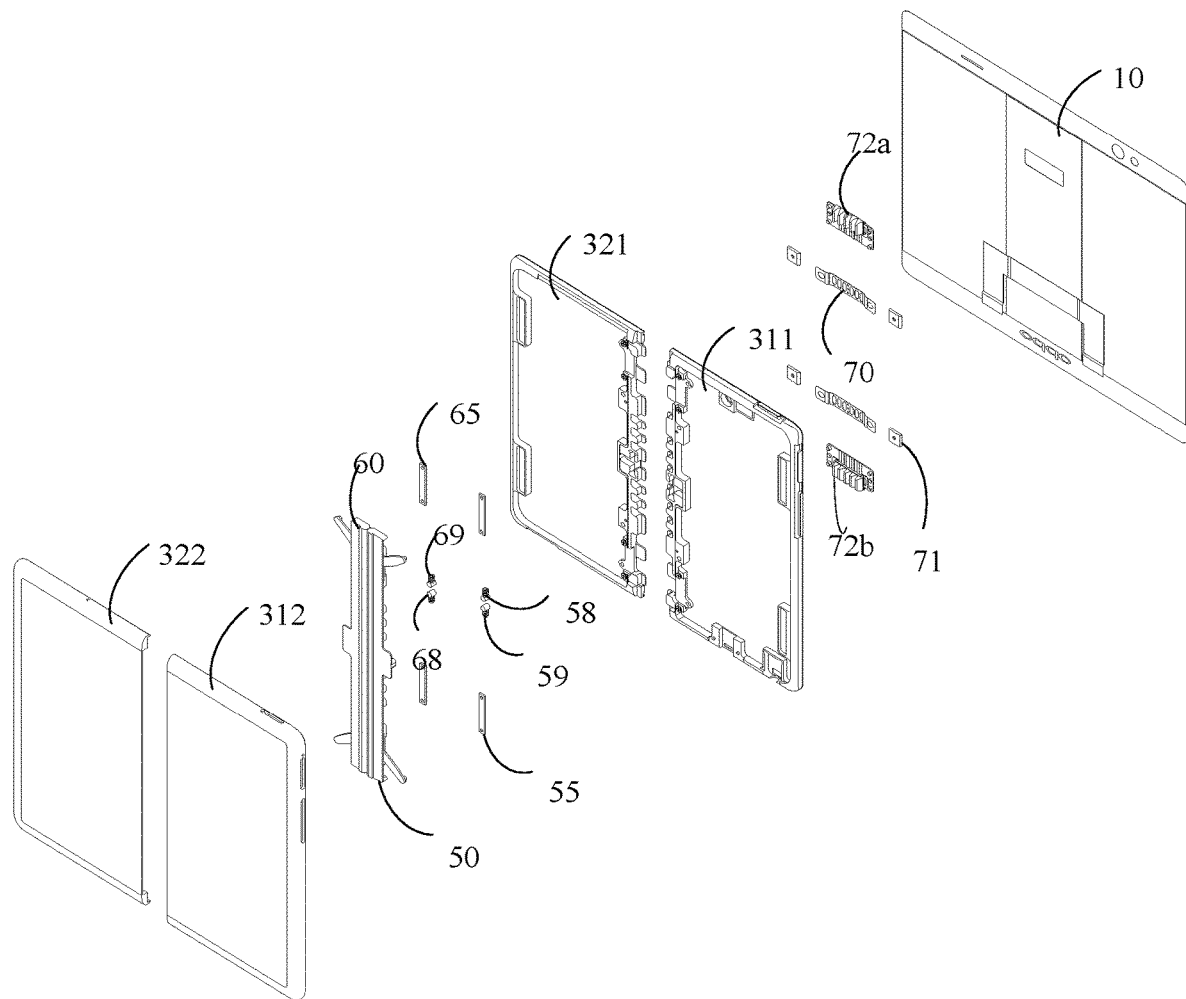
FIG. 3 is an exploded perspective view of the foldable mobile terminal shown in FIG. 1, but shown from a different aspect.

According to some embodiments shown in FIG. 2 and FIG. 3, two first rotation shafts 53 and two first connection rods 54 may be arranged on the first sliding plate 51. The two first rotation shafts 53 may be arranged symmetrically about a middle position of the first sliding plate 51 along a direction parallel to a Z-axis, and the two first connection rods 54 may be arranged symmetrically about a middle position of the first sliding plate 51 along the direction parallel to the Z-axis. In some other embodiments, the number of the first rotation shaft 53 may be one or more, and the number of the first connection rod 54 may be one or more. Slidable extension and retraction of the first sliding plate 51 with respect to the first shell 31 may be achieved with various numbers of the first rotation shafts 53 and the first connection rods 54.

As shown in FIG. 4, FIG. 5, FIG. 6, and FIG. 7, the second rotation assembly 60 may include a second sliding plate 61, a second rotation shaft 63, and a second connection rod 64. The second rotation shaft 63 may be arranged on the second sliding plate 61. A first end 641 of the second connection rod 64 may be slidably hinged to the second rotation shaft 63, and a second end 642 of the second connection rod 64 may be rotatably connected to the second shell 32. The second sliding plate 61 may be at least partially received in the second shell 32, and slidably extend and retract with respect to (i.e., slide away from or towards) the second shell 32. While the first shell 31 and the second shell 32 folds and unfolds symmetrically, the second sliding plate 61 together with the second rotation shaft 63 may slidably extend and retract with respect to (i.e., slide away from or towards) the second shell 32. The second end 642 of the second connection rod 64 may rotate with respect to the second shell 32. The first end 641 of the second connection rod 64 may slide on the second rotation shaft 63 and rotate with respect to the second rotation shaft 63. By changing a level at which the second sliding plate 61 is received in the second shell 32, it is possible to adapt to a length difference generated during the folding and unfolding of the first shell 31 and the second shell 32.

According to some embodiments shown in FIG. 2 and FIG. 3, two second rotation shafts 63 and two second connection rods 64 may be arranged on the second sliding plate 61. The two second rotation shafts 63 may be arranged symmetrically about a middle position of the second sliding plate 61 along the direction parallel to the Z-axis, and the two second connection rods 64 may be arranged symmetrically about a middle position of the second sliding plate 61 along the direction parallel to the Z-axis. In some other embodiments, the number of the second rotation shafts 63 may be one or more, and the number of the second connection rods 64 may be one or more. Slidable extension and retraction of the second sliding plate 61 with respect to the second shell 32 may be achieved with various numbers of the second rotation shafts 63 and the second connection rods 64.

Figure 8:
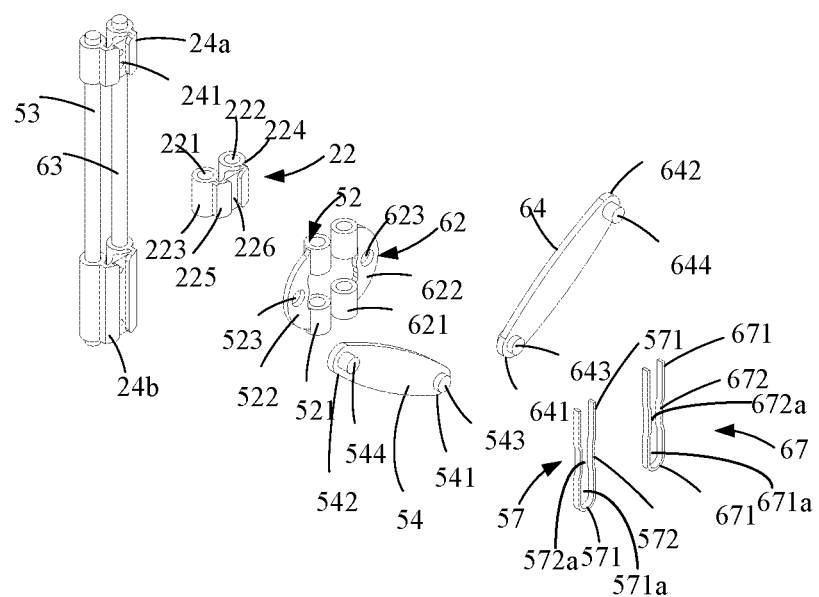
FIG. 8 is an exploded perspective view further illustrating a partial structure of FIG. 7.
Figure 9:
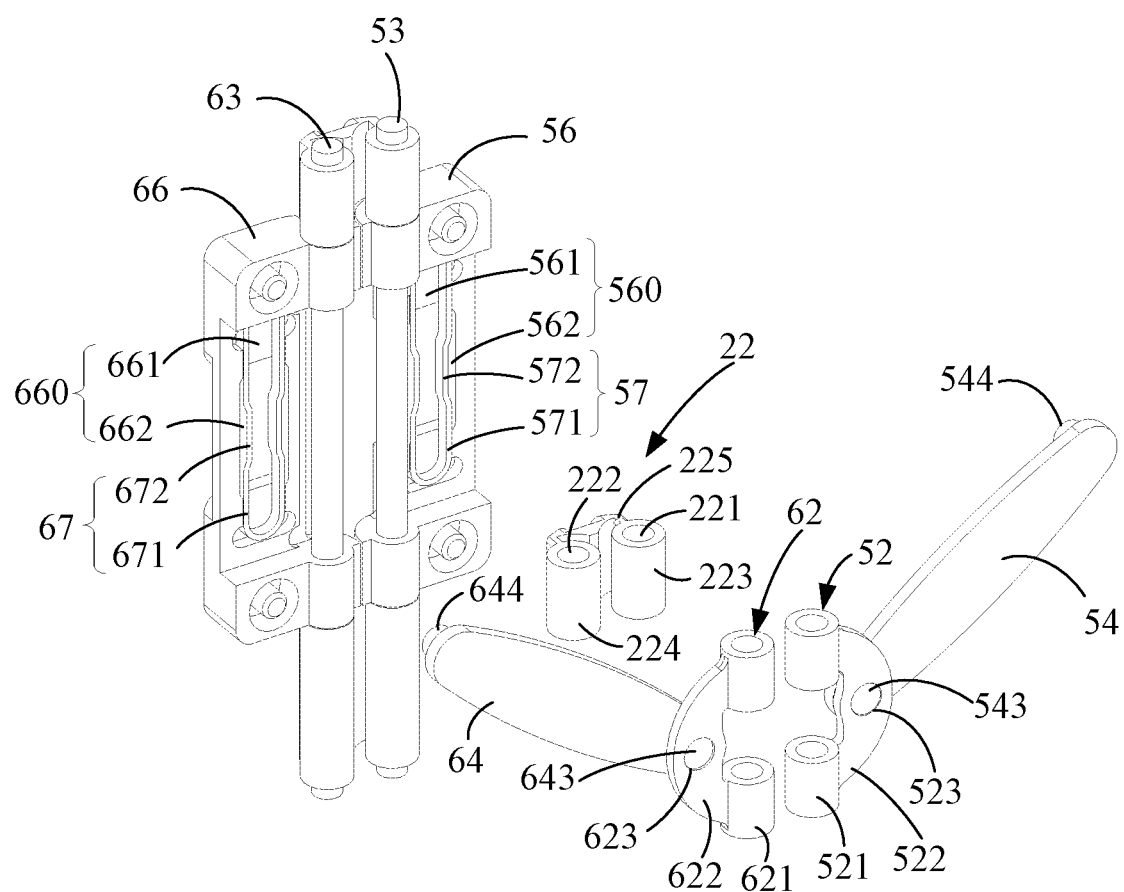
FIG. 9 is an exploded perspective view of a partial structure of FIG. 7, but shown from a different aspect.

As shown in FIG. 8 and FIG. 9, in some embodiments, the foldable mechanism 20 may include a linkage element 22 connected to the first rotation shaft 53 and the second rotation shaft 63. The linkage element 22 may have a first through hole 221 and a second through hole 222. The first through hole 221 and the second through hole 222 may be spaced apart from each other. The first rotation shaft 53 may be arranged to extend through the first through hole 221, and the second rotation shaft 63 may be arranged to extend through the second through hole 222. The linkage element 22 may link the first end 541 of the first connection rod 54 and the first end 641 of the second connection rod 64 to move at the same time. That is, by virtue of the linkage element 22, sliding of the first end 541 of the first connection rod 54 along the first rotation shaft 53 may lead to sliding of the first end 641 of the second connection rod 64 along the second rotation shaft 63, and vice versa.

The linkage element 22 may allow the first connection rod 54 which is slidably hinged to the first rotation shaft 53 and the second connection rod 64 which is slidably hinged to the second rotation shaft 63 to move synchronously. That is, the slidable extension and retraction of the first sliding plate 51 with respect to the first shell 31 is synchronous with the slidable extension and retraction of the second sliding plate 61 with respect to the second shell 32, such that a symmetric folding and unfolding of the first shell 31 and the second shell 32 may be further achieved. The linkage element 22 may be made of metals or plastics.

In other embodiments, functions of the linkage element 22 may be achieved by other components. For example, a component configured to achieve a slidable hinge between the first connection rod 54 and the first rotation shaft 53 and a component configured to achieve a slidable hinge between the second connection rod 64 and the second rotation shaft 63 may be configured as an integral component. By configuring an integral component to achieve the slidable hinge, the first connection rod 54 which is slidably hinged to the first rotation shaft 53 and the second connection rod 64 which is slidably hinged to the second rotation shaft 63 may move synchronously.

Figure 7:
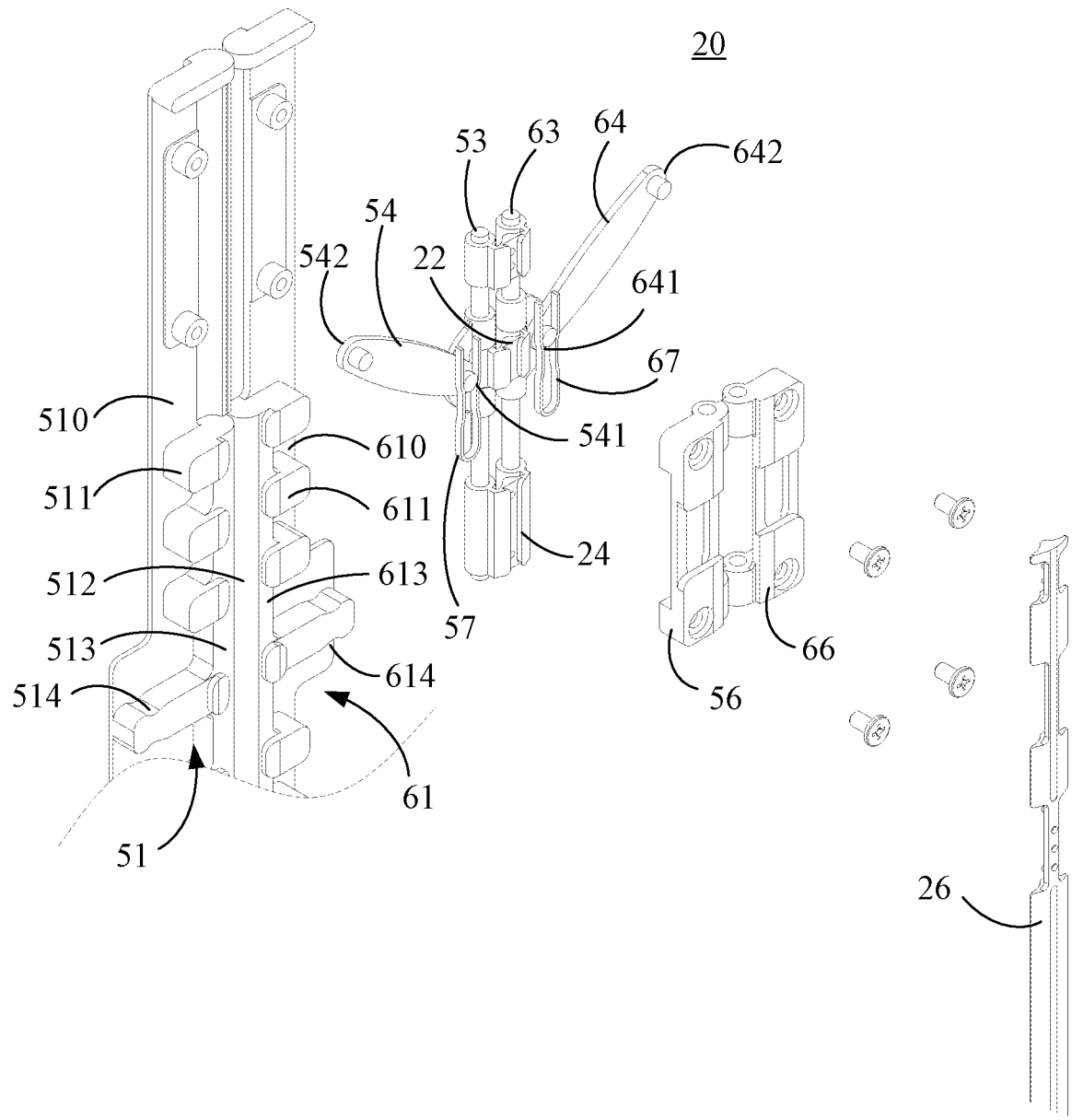
FIG. 7 is an exploded perspective view of the foldable mechanism of FIG. 4.

As shown in FIG. 7, FIG. 8, and FIG. 9, in some embodiments, the first rotation assembly 50 may further include a first sliding member 52 configured to achieve the slidable hinge between the first connection rod 54 and the first rotation shaft 53. The first sliding member 52 may be arranged to slidably sleeve on the first rotation shaft 53, and the first end 541 of the first connection rod 54 may be rotatably connected to the first sliding member 52.

In some embodiments, the first sliding member 52 may include two sleeve tubes 521 and a connection arm 522 connected between the two sleeve tubes 521. The first rotation shaft 53 may extend through the sleeve tubes 521 of the first sliding member 52. The first sliding member 52 may slide along the first rotation shaft 53 and rotate with respect to the first rotation shaft 53.

The first end 541 of the first connection rod 54 may be rotatably connected to the connection arm 522 of the first sliding member 52. Further, the connection arm 522 of the first sliding member 52 may have a first positioning hole 523, and the first end 541 of the first connection rod 54 may have a first positioning protrusion 543. The first positioning protrusion 543 may be inserted into the first positioning hole 523.

The second rotation assembly 60 may further include a second sliding member 62. The slidable hinge between the second connection rod 64 and the second rotation shaft 63 may be achieved by the second sliding member 62. The second sliding member 62 may be arranged to sleeve on the second rotation shaft 63 in a slidable manner, and the first end 641 of the second connection rod 64 may be rotatably connected to the second sliding member 62.

In some embodiments, the second sliding member 62 may include two sleeve tubes 621 and a connection arm 622 connected between the two sleeve tubes 621. The second rotation shaft 63 may extend through the sleeve tubes 621 of the second sliding member 62. The second sliding member 62 may slide along the second rotation shaft 63 and rotate with respect to the second rotation shaft 63.

The first end 641 of the second connection rod 64 may be rotatably connected to the connection arm 622 of the second sliding member 62. Further, the connection arm 622 of the second sliding member 62 may have a second positioning hole 623, and a first end 641 of the second connection rod 64 may have a second positioning protrusion 643. The second positioning protrusion 643 may be inserted into the second positioning hole 623.

In some embodiments, the linkage element 22 may include a first arm portion 223 having the first through hole 221 and a second arm portion 224 having the second through hole 222. The first arm portion 223 may be arranged between the two sleeve tubes 521 of the first sliding member 52. The second arm portion 224 may be arranged between the two sleeve tubes 621 of the second sliding member 62. The first rotation shaft 53 may extend through the first through hole 221, and the second rotation shaft 63 may extend through the second through hole 222. The linkage element 22 may serve as a link between the first sliding member 52 and the second sliding member 62, such that the sliding of the first sliding member 52 along the first rotation shaft 53 may be synchronous with the sliding of the second sliding member 62 along the second rotation shaft 63.

As shown in FIG. 4, FIG. 5, FIG. 6, and FIG. 7, in some embodiments, the first rotation assembly 50 may further include a first support 56, and the first rotation shaft 53 may be configured on the first sliding plate 51 through the first support 56. Further, the first support 56 may be fixed on the first sliding plate 51 by screw fastening. The first rotation shaft 53 may extend through the first support 56, and the first sliding member 52 may be arranged between the first support 56 and the first sliding plate 51. By arranging the first support 56, relative movement of the first sliding member 52, the first end 541 of the first connection rod 54, and the first rotation shaft 53 may be restricted within a space between the first support 56 and the first sliding plate 51, such that a possibility of the first end 541 of the first connection rod 54 detaching from the first sliding member 52 may be reduced.

Figure 11:
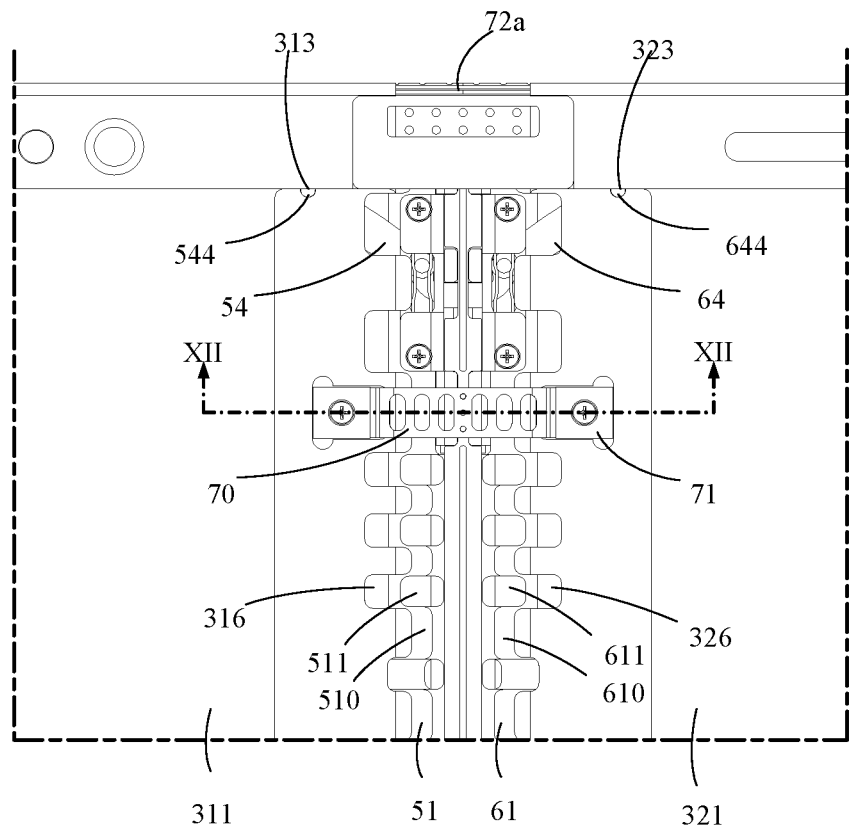
FIG. 11 is a front view of a partial structure shown in FIG. 10.
Figure 13:
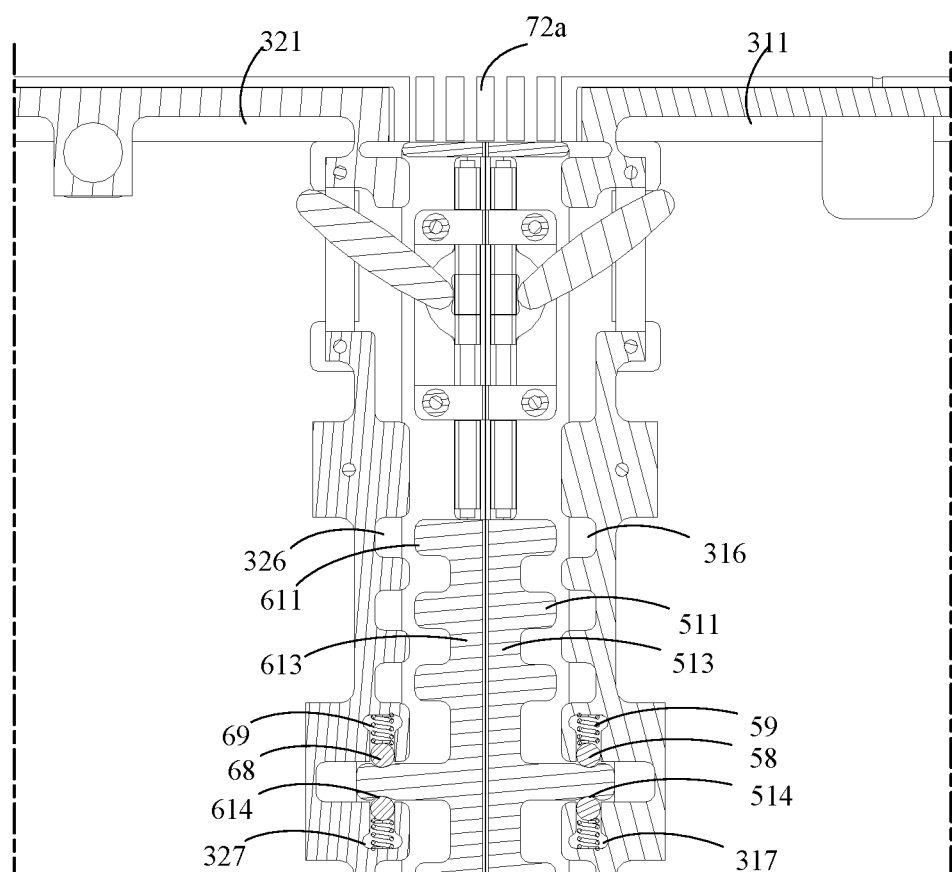
FIG. 13 is a cross sectional view from a back of the structure shown in FIG. 10.
Figure 15:
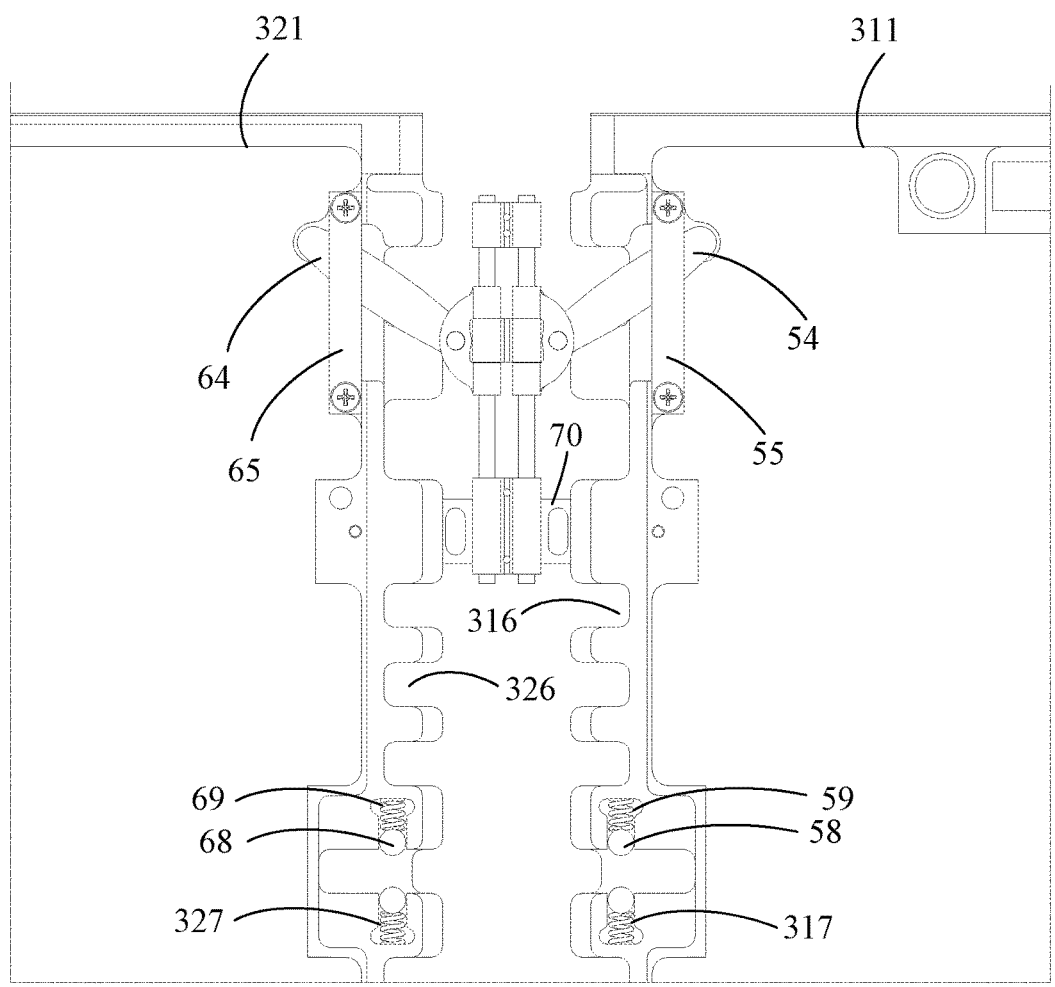
FIG. 15 is a back view of the structure shown in FIG. 14.

The rotatable connection between the second end 542 of the first connection rod 54 and the first shell 31 may be achieved by a rotatable connection between the second end 542 of the first connection rod 54 and the first front shell 311. Alternatively, the rotatable connection between the second end 542 of the first connection rod 54 and the first shell 31 may be achieved by a rotatable connection between the second end 542 of the first connection rod 54 and the first back shell 312. Alternatively, the rotatable connection between the second end 542 of the first connection rod 54 and the first shell 31 may be achieved by rotatably connecting the second end 542 of the first connection rod 54 to the first front shell 311 and the first back shell 312 at the same time. In some embodiments, as shown in FIG. 8, FIG. 9, and FIG. 11, the first front shell 311 may have a first connection hole 313, and a first connection protrusion 544 may be arranged at the second end 542 of the first connection rod 54. The first connection protrusion 544 may be inserted into the first connection hole 313. Further, as shown in FIG. 13 and FIG. 15, the first rotation assembly 50 may further include a first pressing sheet 55. The first pressing sheet 55 may be connected to the first front shell 311, and configured to limit a position of the first connection rod 54, such that the first connection rod 54 may be disposed between the first pressing sheet 55 and the first front shell 311.

As shown in FIG. 4, FIG. 5, FIG. 6, and FIG. 7, in some embodiments, the second rotation assembly 60 may further include a second support 66, and the second rotation shaft 63 may be configured on the second sliding plate 61 through the second support 66. Further, the second support 66 may be fixed on the second sliding plate 61 by screw fastening. The second rotation shaft 63 may extend through the second support 66, and the second sliding member 62 may be arranged between the second support 66 and the second sliding plate 61. By arranging the second support 66, relative movement of the second sliding member 62, the first end 641 of the second connection rod 64, and the second rotation shaft 63 may be restricted within a space between the second support 66 and the second sliding plate 61, such that a possibility of the first end 641 of the second connection rod 64 detaching from the second sliding member 62 may be reduced.

The rotatable connection between the second end 642 of the second connection rod 64 and the second shell 32 may be achieved by a rotatable connection between the second end 642 of the second connection rod 64 and the second front shell 321. Alternatively, the rotatable connection between the second end 642 of the second connection rod 64 and the second shell 32 may be achieved by a rotatable connection between the second end 642 of the second connection rod 64 and the second back shell 322. Alternatively, the rotatable connection between the second end 642 of the second connection rod 64 and the second shell 32 may be achieved by rotatably connecting the second end 642 of the second connection rod 64 to the second front shell 321 and the second back shell 322 at the same time. In some embodiments, as shown in FIG. 8, FIG. 9, and FIG. 11, the second front shell 321 may have a second connection hole 323, and a second connection protrusion 644 may be arranged at the second end 642 of the second connection rod 64. The second connection protrusion 644 may be inserted into the second connection hole 323. Further, as shown in FIG. 13 and FIG. 15, the second rotation assembly 60 may further include a second pressing sheet 65. The second pressing sheet 65 may be connected to the second front shell 321, and configured to limit a position of the second connection rod 64, such that the second connection rod 64 may be disposed between the second pressing sheet 65 and the second front shell 321.

As shown in FIG. 8 and FIG. 9, the foldable mechanism 20 may further include a first shaft sleeve 24a and a second shaft sleeve 24b. The first shaft sleeve 24a may be disposed at one end of the first rotation shaft 53 and one end of the second rotation shaft 63, and may be connected to both the first rotation shaft 53 and the second rotation shaft 63. The second shaft sleeve 24b may be disposed at the other end of the first rotation shaft 53 and the other end of the second rotation shaft 63, and may be connected to both the first rotation shaft 53 and the second rotation shaft 63. The first and the second shaft sleeves 24a and 24b may be configured to fix the first rotation shaft 53 on the first support 56, and fix the second rotation shaft 63 on the second support 66. The first support 56, the second support 66, the first rotation shaft 53, and the second rotation shaft 63 may be provided with equal number. In some embodiments, the number of the first supports 56 and the number of the second supports 66 may both be two. Each first support 56 may be arranged at a corresponding end of the first sliding plate 51 along the direction parallel to the Z-axis, and each second support 66 may be arranged at a corresponding end of the second sliding plate 61 along the direction parallel to the Z-axis.

In some embodiments, as shown in FIG. 4 and FIG. 7, the foldable mechanism 20 may further include a supportive strip 26. The supportive strip 26 may be arranged between the first rotation assembly 50 and the second rotation assembly 60. The supportive strip 26 may be configured to support the flexible display screen 10. The supportive strip 26 may extend for a certain length along the direction parallel to the Z-axis in order to be arranged in a gap between the first sliding plate 51 and the second sliding plate 61. According to some embodiments provided with the first support 56 and the second support 66, the supportive strip 26 may further extend into a gap between the first support 56 and the second support 66. The supportive strip 26, the first sliding plate 51, the second sliding plate 61, the first support 56, the second support 66, the first front shell 311, and the second front shell 321 may cooperatively support the flexible display screen 10.

As shown in FIG. 8 and FIG. 9, the linkage element 22 may have a receiving recess 226. At least a partial structure of the supportive strip may be received in the receiving recess 226. In some embodiments, the linkage element 22 may include a connection portion 225 connecting with the first arm portion 223 and the second arm portion 224, and the receiving recess 226 may be formed on the connection portion 225.

As shown in FIG. 8 and FIG. 9, in other embodiments, at least one of the first shaft sleeve 24a and the second shaft sleeve 24b may also have a receiving recess 241, and at least a partial structure of the supportive strip 26 may be received in the receiving recess 241. At least one of the connection between the supportive strip 26 and the first shaft sleeve 24a and the second shaft sleeve 24b and the connection between the supportive strip 26 and the linkage element 22 may be achieved by welding or other means.

Figure 24:
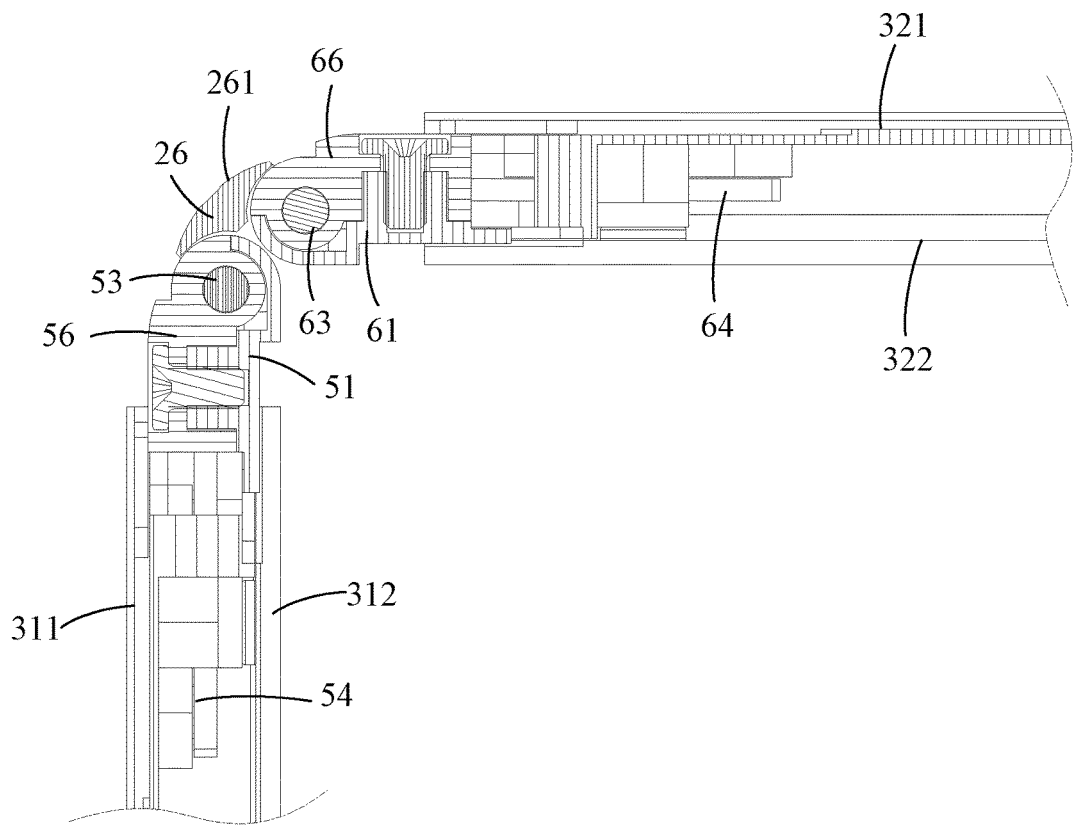
FIG. 24 is a sectional view of a partial structure of a foldable mobile terminal in a semi-folded (or a semi-unfolded) state according to some embodiments of the present disclosure.
Figure 25:
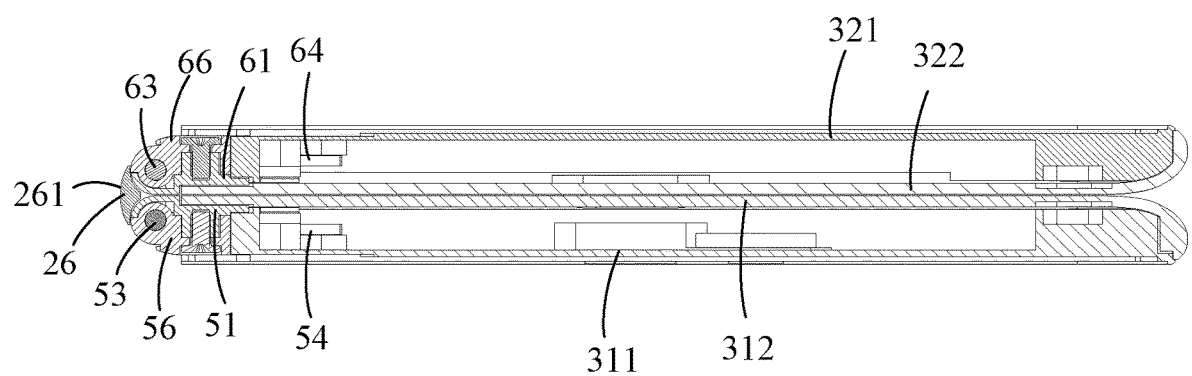
FIG. 25 is a sectional view of a partial structure of a foldable mobile terminal in a folded state according to some embodiments of the present disclosure.

As shown in FIG. 20, FIG. 23, FIG. 24, and FIG. 25, a top face 261 of the supportive strip 26 faces towards the flexible display screen 10, and the top face 261 of the supportive strip 26 may be a curved face. When the foldable mobile terminal is in a semi-folded state as shown in FIG. 24 or in a folded state as shown in FIG. 25, as the supportive strip 26 has a curved face, a curvature of a contour of the mobile terminal may not be changed sharply during the folding of the first shell 31 and the second shell 32. Therefore, the flexible display screen 10 may be better supported.

As shown in FIG. 7, FIG. 8, and FIG. 9, in some embodiments, the first rotation assembly 50 may further include a first elastic sheet 57 arranged on the first sliding plate 51. The first end 541 of the first connection rod 54 may reach two extreme positions along a direction of sliding, the first elastic sheet 57 may include two first engaging portions 571. Each of the two first engaging portions 571 may correspond to each of the two extreme positions. In the embodiments provided with the first support 56, the first elastic sheet 57 may be fixed on the first sliding plate 51 through the first support 56, and the first elastic sheet 57 may be disposed inside the first support 56.

The two first engaging portions 571 of the first elastic sheet 57 may respectively correspond to two ends of a sliding path of the first end 541 of the first connection rod 54 while the first end 541 slides along the first rotation shaft 53. To some extent, interference may be generated between each first engaging portion 571 and the first end 541 of the first connection rod 54, such that the first engaging portion 571 may apply a clamping force to the first end 541 of the first connection rod 54, and the position of the first connection rod 54 may not be changed randomly. Therefore, the first sliding plate 51 may be arranged at a stable position with respect to the first shell 31, that is, the foldable mobile terminal may stably remain in the folded or unfolded state.

In some embodiments, the first positioning protrusion 543 at the first end 541 of the first connection rod 54 may extend through two opposing sides of the first end 541. An end of the first positioning protrusion 543 may be engaged in the first positioning hole 523 of the first sliding member 52, and an opposing end of the first positioning protrusion 543 may be inserted into the first engaging portion 571 of the first elastic sheet 57. The first engaging portion 571 may clamp the first positioning protrusion 543 to apply a certain clamping force to the first connection rod 54.

In some embodiments, the first elastic sheet 57 may further include a first damping portion 572 disposed between the two first engaging portions 571. When the first end 541 of the first connection rod 54 slides from the first engaging portion 571 to the first damping portion 572, a resistance may be increased. Increasing of the resistance may be achieved as a clamping force applied to the first positioning protrusion 543 by the first damping portion 572 is greater than the clamping force applied to the first positioning protrusion 543 by the first engaging portion 571. For example, the first elastic sheet 57 may be stadium-shaped with an opening at an end and closed at an opposing end. The two first engaging portions 571 may be arranged at the two opposite ends of the first elastic sheet 57, and the first damping portion 572 may be arranged at a middle portion of the first elastic sheet 57. A first gap 572a formed in the first damping portion 572 for the first positioning protrusion 543 to extend through may be smaller than a second gap 571a formed in the first engaging portion 571 for the first positioning protrusion 543 to extend through. Therefore, during the sliding from the first engaging portion 571 to the first damping portion 572, the first connection rod 54 may receive an increased resistance. By arranging the first elastic sheet 57 in such manner, when rotating the first shell 31 and the second shell 32 of the foldable mobile terminal, a user may feel the resistance more obviously.

In some other embodiments, the first elastic sheet 57 may be in shape of a closed loop. Further, in yet other embodiments, the first elastic sheet 57 may include two separated strips. Two ends of each of the two separated strips may be fixed on the first sliding plate 51 through the first support 56 or other components (or by other means), such that the first connection rod 54 may be applied with different resistances when the first connection rod 54 is at various positions of the sliding path along the first rotation shaft 53.

As shown in FIG. 9, the first support 56 may have a first receiving cavity 560, and the first elastic sheet 57 may be received in the first receiving cavity 560. After the first support 56 is fixed on the first sliding plate 51, the first sliding plate 51 may close the first receiving cavity 560, such that the first elastic sheet 57 may be fixed inside the first receiving cavity 560.

Further, the first receiving cavity 560 may include two first positioning cavities 561 and a first releasing cavity 562. Each of the two first positioning cavities 561 may correspond to each of the first engaging portion 571 of the first elastic sheet 57. The first releasing cavity 562 may be formed between the two first positioning cavities 561. A size of the first releasing cavity 562 may be greater than a size of each first positioning cavity 561. After the first engaging portion 571 is arranged in the first positioning cavity 561, the first engaging portion 571 may be fixed to be unmovable. The first damping portion 572 arranged between the two first engaging portions 571 may be correspondingly arranged in the first releasing cavity 562. The first releasing cavity 562 may offer a space allowing the first damping portion 572 to be elastically deformed.

In some embodiments, the second rotation assembly 60 may further include a second elastic sheet 67 arranged on the second sliding plate 61. The first end 641 of the second connection rod 64 may reach two extreme positions along a direction of sliding, and the second elastic sheet 67 may include two second engaging portions 671. Each of the two second engaging portions 671 may correspond to each of the two extreme positions. In the embodiments provided with the second support 66, the second elastic sheet 67 may be fixed on the second sliding plate 61 through the second support 66, and the second elastic sheet 67 may be disposed inside the second support 66.

The two second engaging portions 671 of the second elastic sheet 67 may respectively correspond to two ends of a sliding path of the first end 641 of the second connection rod 64 while the first end 641 slides along the second rotation shaft 63. To some extent, interference may be generated between each second engaging portion 671 and the first end 641 of the second connection rod 64, such that the second engaging portion 671 may apply a clamping force to the first end 641 of the second connection rod 64, and the position of the second connection rod 64 may not be changed randomly. Therefore, the second sliding plate 61 may be arranged at a stable position with respect to the second shell 32, that is the foldable mobile terminal may stably remain in the folded or unfolded state.

In some embodiments, the second positioning protrusion 643 at the first end 641 of the second connection rod 64 may extend through two opposing sides of the first end 641. An end of the second positioning protrusion 643 may be engaged in the second positioning hole 623 of the second sliding member 62, and an opposing end of the second positioning protrusion 643 may be inserted into the second engaging portion 671 of the second elastic sheet 67. The second engaging portion 671 may clamp the second positioning protrusion 643 to apply a certain clamping force to the second connection rod 64.

Figure 22:
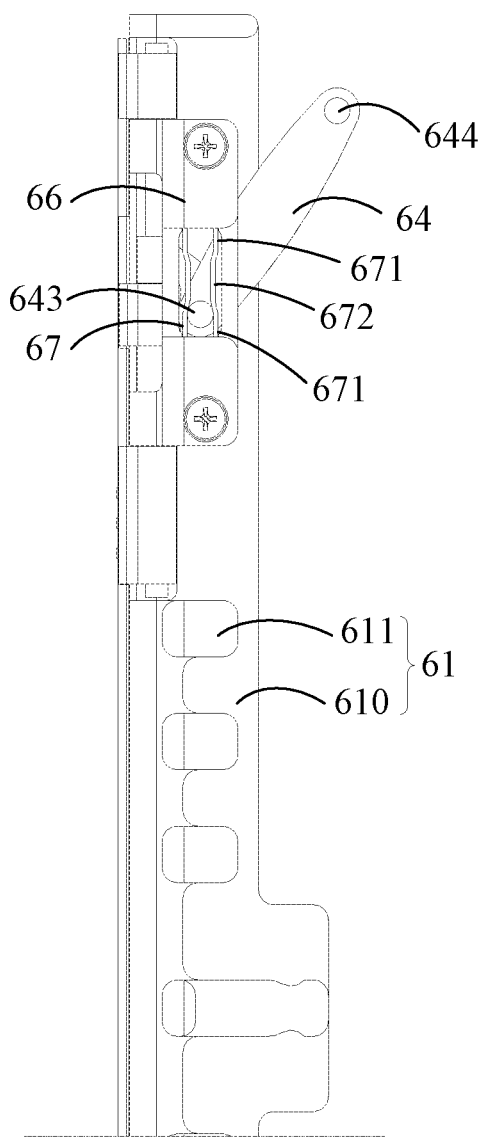
FIG. 22 is a front view of the foldable mechanism shown in FIG. 21.
Figure 23:
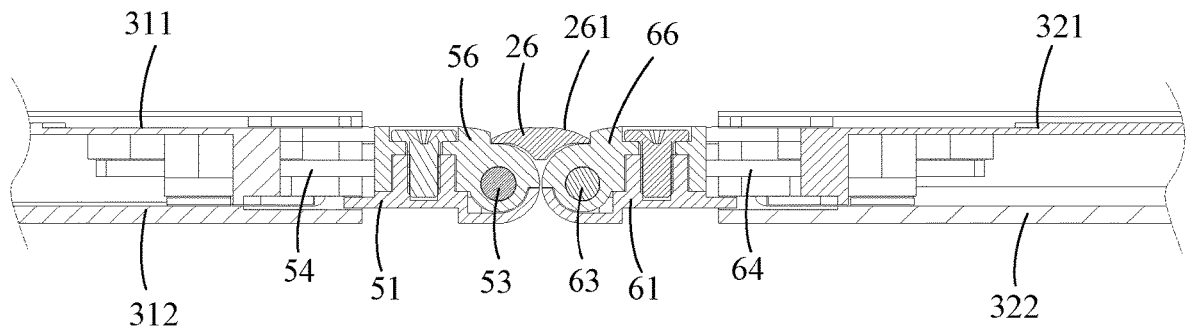
FIG. 23 is a sectional view of a partial structure of a foldable mobile terminal in an unfolded state according to some embodiments of the present disclosure.

As shown in FIG. 4, FIG. 5, FIG. 21, and FIG. 22, FIG. 5 illustrates the sliding mechanism 20 in the unfolded state, and the second positioning protrusion 643 arrange at the first end 641 of the second connection rod 64 may be inserted into one of the second engaging portions 671, as shown in FIG. 5. FIG. 22 illustrates the sliding mechanism 20 in the folded state, and the second positioning protrusion 643 arrange at the first end 641 of the second connection rod 64 may be inserted into the other one of second engaging portions 671, as shown in FIG. 22.

In some embodiments, the second elastic sheet 67 may further include a second damping portion 672 disposed between the two second engaging portions 671. When the first end 641 of the second connection rod 64 slides from the second engaging portion 671 to the second damping portion 672, a resistance may be increased. Increasing of the resistance may be achieved as a clamping force applied to the second positioning protrusion 643 by the second damping portion 672 is greater than the clamping force applied to the second positioning protrusion 643 by the second engaging portion 671. For example, the second elastic sheet 67 may be stadium-shaped with an opening at an end and closed at an opposing end. The two second engaging portions 671 may be arranged at two ends of the second elastic sheet 67, and the second damping portion 672 may be arranged at a middle portion of the second elastic sheet 67. A third gap 672a formed in the second damping portion 672 for the second positioning protrusion 643 to extend through may be smaller than a fourth gap 671a formed in the second engaging portion 671 for the second positioning protrusion 643 to extend through. Therefore, during the sliding from the second engaging portion 671 to the second damping portion 672, the second connection rod 64 may receive an increased resistance. By arranging the second elastic sheet 67 in this manner, when rotating the first shell 31 and the second shell 32 of the foldable mobile terminal, the user may feel the resistance more obviously.

In some other embodiments, the second elastic sheet 67 may be in shape of a closed loop. Further, in yet other embodiments, the second elastic sheet 67 may include two separated strips. Two ends of each of the two separated strips may be fixed on the second sliding plate 61 through the second support 66 or other components (or by other means), such that the second connection rod 64 may be applied with different resistances when the second connection rod 64 is at various positions of the sliding path along the second rotation shaft 63.

As shown in FIG. 9, the second support 66 may have a second receiving cavity 660, and the second elastic sheet 67 may be received in the second receiving cavity 660. After the second support 66 is fixed on the second sliding plate 61, the second sliding plate 61 may close the second receiving cavity 660, such that the second elastic sheet 67 may be fixed inside the second receiving cavity 660.

Further, the second receiving cavity 660 may include two second positioning cavities 661 and a second releasing cavity 662. Each of the two second positioning cavities 661 may correspond to each second engaging portion 671 of the second elastic sheet 67. The second releasing cavity 662 may be formed between the two second positioning cavities 661. A size of the second releasing cavity 662 may be greater than a size of each second positioning cavity 661. After the second engaging portion 671 is arranged in the second positioning cavity 661, the second engaging portion 671 may be fixed to be unmovable. The second damping portion 672 arranged between the two second engaging portions 671 may be arranged in the second releasing cavity 662. The second releasing cavity 662 may offer a space allowing the second damping portion 672 to be elastically deformed.

Figure 10:
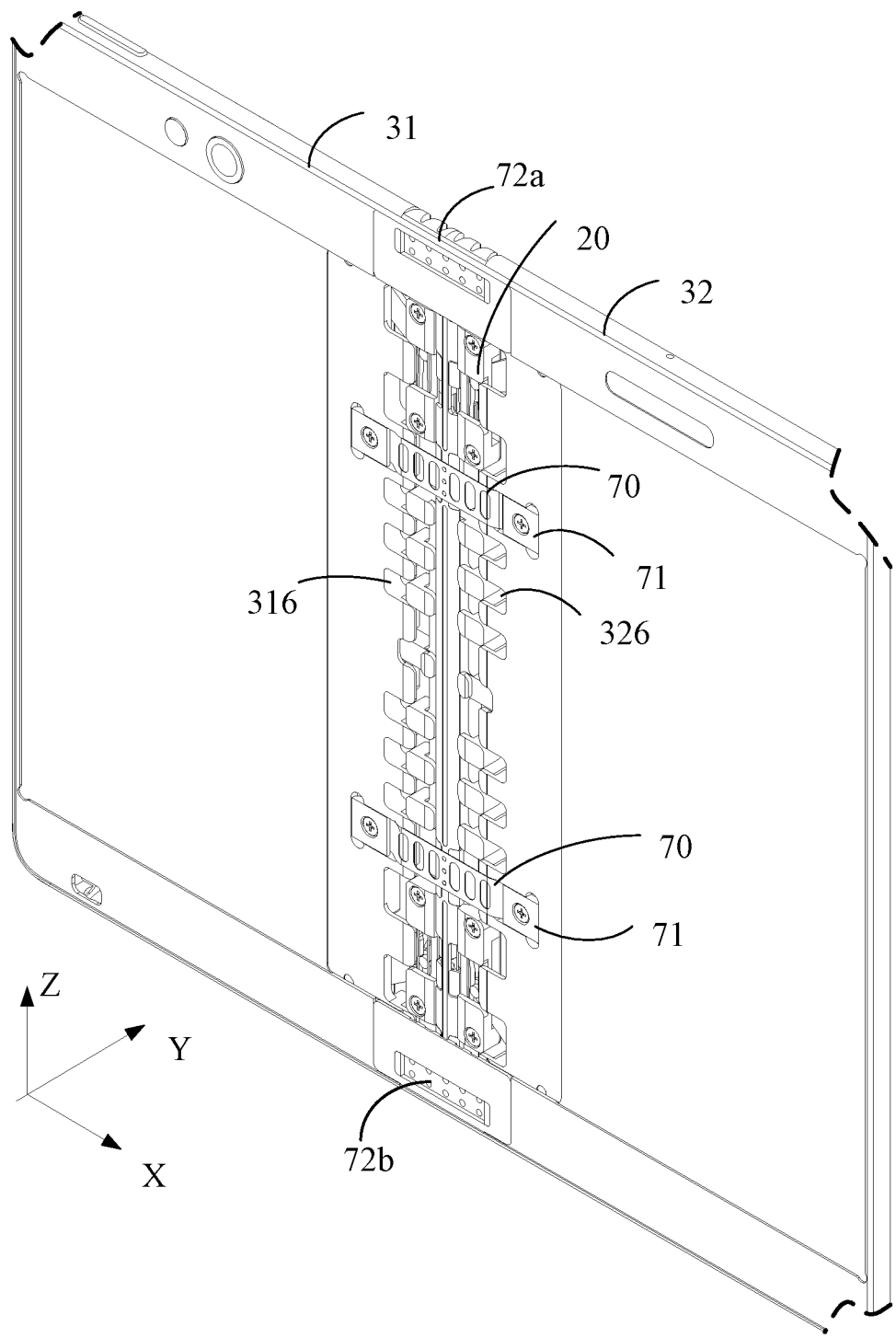
FIG. 10 is a perspective view of a foldable mobile terminal with a flexible display screen omitted according to some embodiments of the present disclosure.
Figure 12:
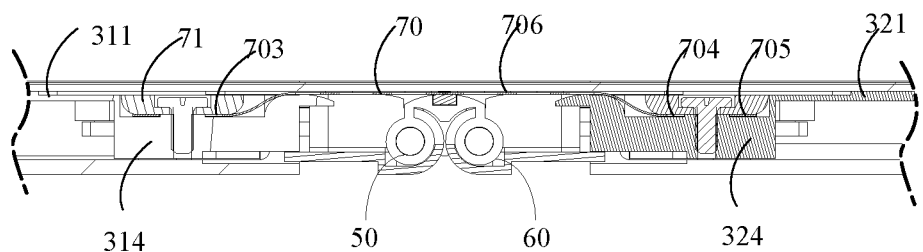
FIG. 12 is a cross sectional view taken along a line A-A of FIG. 11.

As shown in FIG. 10, FIG. 11, and FIG. 12, in some embodiments, the foldable mobile terminal may further include a joining sheet 70 and two pressing elements 71. The joining sheet 70 may cross over the first rotation assembly 50 and the second rotation assembly 60, and each end of the joining sheet 70 may be rotatably connected to the first shell 31 and the second shell 32 through each of the two pressing elements 71 respectively. A change of the length generated during the rotation of the first shell 31 and the second shell 32 may adapt by the extension and retraction of the first rotation assembly 50 and the second rotation assembly 60 of the sliding mechanism 20 with respect to the first shell 31 and the second shell 32, respectively. In this way, a contour of the foldable mobile terminal may be uniform and complete during folding and unfolding. By arranging the joining sheet 70, the first shell 31 and the second shell 32 may be protected from being overly stretched, and a possibility of the flexible display screen 10 being damaged by the stretching may be reduced.

Figure 16:
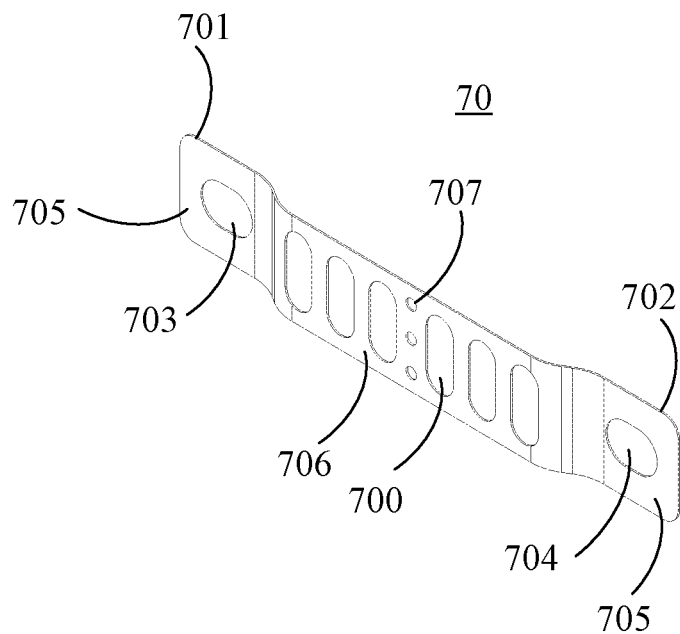
FIG. 16 is view of an elastic sheet of a foldable mechanism.

As shown in FIG. 16, a first end 701 of the joining sheet 70 may have a first elongated hole 703, and a second end 702 of the joining sheet 70 may have a second elongated hole 704. One of the pressing elements 71 may extend through the first elongated hole 703, and be further fixedly connected to the first shell 31, and the other of the pressing elements 71 may extend through the second elongated hole 704, and be further fixedly connected to the second shell 32. When the first rotation assembly 50 slides towards and away from the first shell 31 and the second rotation assembly 60 slides towards and away from the second shell 32, the joining sheet 70 may move with respect to the pressing elements 71 along a direction to which the first elongated hole 703 and the second elongated hole 704 elongate, that is, the joining sheet 70 may move with respect to the first shell 31 and the second shell 32. As shown in FIG. 12, when the foldable mobile terminal is in the unfolded state, an outer end of the first elongated hole 703 and an outer end of the second elongated hole 704 of the joining sheet 70, that is, an end of the first elongated hole 703 away from the first rotation assembly 50 and an end of the second elongated hole 704 away from the second rotation assembly 60, may abut against the corresponding pressing element 71. In this way, a possibility of the first shell 31 and the second shell 32 departing from each other continually may be reduced, and the first shell 31 and the second shell 32 may be protected from being overly stretched. During folding, by virtue of space of the first and the second elongated holes, the joining sheet 70 may slide with respect to the first shell 31 and the second shell 32 to adapt to the length change of the first and the second shells 31 and 32. In some embodiments, holes in other shapes may be formed to replace the first elongated hole 703 and the second elongated hole 704, and two pressing elements 71 may be connected to the first or second shells in other means.

The joining sheet 70 may include two joining portions 705 respectively located at the first end 701 and the second end 702, and a supportive portion 706 connected between the two joining portions 705. Each of the two joining portions 705 may be connected to each pressing element 71, and the supportive portion 706 may be configured to support the flexible display screen 10.

In some embodiments, the pressing element 71 may include a screw or other fastening elements. The screw or other fastening elements of one pressing element 71 may extend through the first elongated hole 703, and then connect the joining sheet 70 to the first shell 31. The screw or other fastening elements of the other pressing element 71 may extend through the second elongated hole 704, and then connect the joining sheet 70 to the second shell 32. In some embodiments, each pressing element 71 may be cubic, and may include no screw or other fastening elements. One pressing element 71 may be configured to press on the first end 701 of the joining sheet 70, and the other pressing element 71 may be configured to press on the second end 702 of the joining sheet 70. An additional fastening element may be configured to extend through one pressing element 71 and the first elongated hole 703 to fasten with the first shell 31, and another additional fastening element may be configured to extend through the other pressing element 71 and the second elongated hole 704 to fasten with the second shell 32. For example, the first front shell 311 may include a first mounting portion 314, the first end 701 of the joining sheet 70 may be slidably connected to the first mounting portion 314 through one of the pressing elements 71. Similarly, the second front shell 321 may include a second mounting portion 324, and the second end 702 of the joining sheet 70 may be slidably connected to the second mounting portion 324 through the other of the pressing elements 71. In some embodiments, the first mounting portion 314 may have a first mounting hole to allow a fastening element to be mounted, such that one pressing element 71 and the first end 701 of the joining sheet 70 may be fastened with the first shell 31. Similarly, the second mounting portion 324 may have a second mounting hole to allow another fastening element to be mounted, such that the other pressing element 71 and the second end 702 of the joining sheet 70 may be fastened with the second shell 32.

In some embodiments, a bending portion may be formed at an intersection between the supportive portion 706 and each of the two joining portions 705. As shown in FIG. 12, each of the first mounting portion 314 and the second mounting portion 324 may be recessed to engage with the bending portion of the corresponding joining sheet 70 and configured to receive the corresponding pressing element 71.

The joining sheet 70 may have a plurality of through holes 700 with distance apart from each other. In some embodiments, the plurality of through holes 700 may be formed on the supportive portion 706. The through holes 700 enable the joining sheet 70 to be bent easily, such that the joining sheet 70 may better fit with the first rotation assembly 50 and the second rotation assembly 60, and a possibility of the joining sheet 70 generating crease to impact the effect of supporting the flexible display screen 10 may be reduced.

In some embodiments, a fixing structure 707 connected to the supportive strip 26 may be arranged on the supportive portion 706. In some embodiments, the fixing structure 707 may be a hole for welding. As the joining sheet 70 crosses over the supportive strip 26, the joining sheet 70 may be fixedly connected to the supportive strip 26 by welding. In some other embodiments, the fixing structure 707 may be a protrusion, and a hole may be formed on the supportive strip, the protrusion may be adapted to or match with the hole, such that the joining sheet 70 may be fixedly connected to the supportive strip 26 through the fixing structure 707.

In some embodiments, the number of the joining sheets 70 may be two. It may be understood that, in other embodiments, the number of the joining sheets 70 may be increased or decreased as required.

As shown in FIG. 10 and FIG. 11, in some embodiments, the foldable mobile terminal may further include a first decoration component 72a and a second decoration component 72b. The first decoration component 72a may be disposed at one end of the foldable mechanism 20 along the direction parallel to the Z-axis, further disposed in the gap formed between the first shell 31 and the second shell 32. The second decoration component 72b may be disposed at the other end of the foldable mechanism 20 along the direction parallel to the Z-axis, further disposed in the gap formed between the first shell 31 and the second shell 32. The first and the second decoration components 72a and 72b may be configured to cover structures at each end of the foldable mechanism 20, such that the structures may not be exposed to an outside to impact the appearance.

Figure 14:
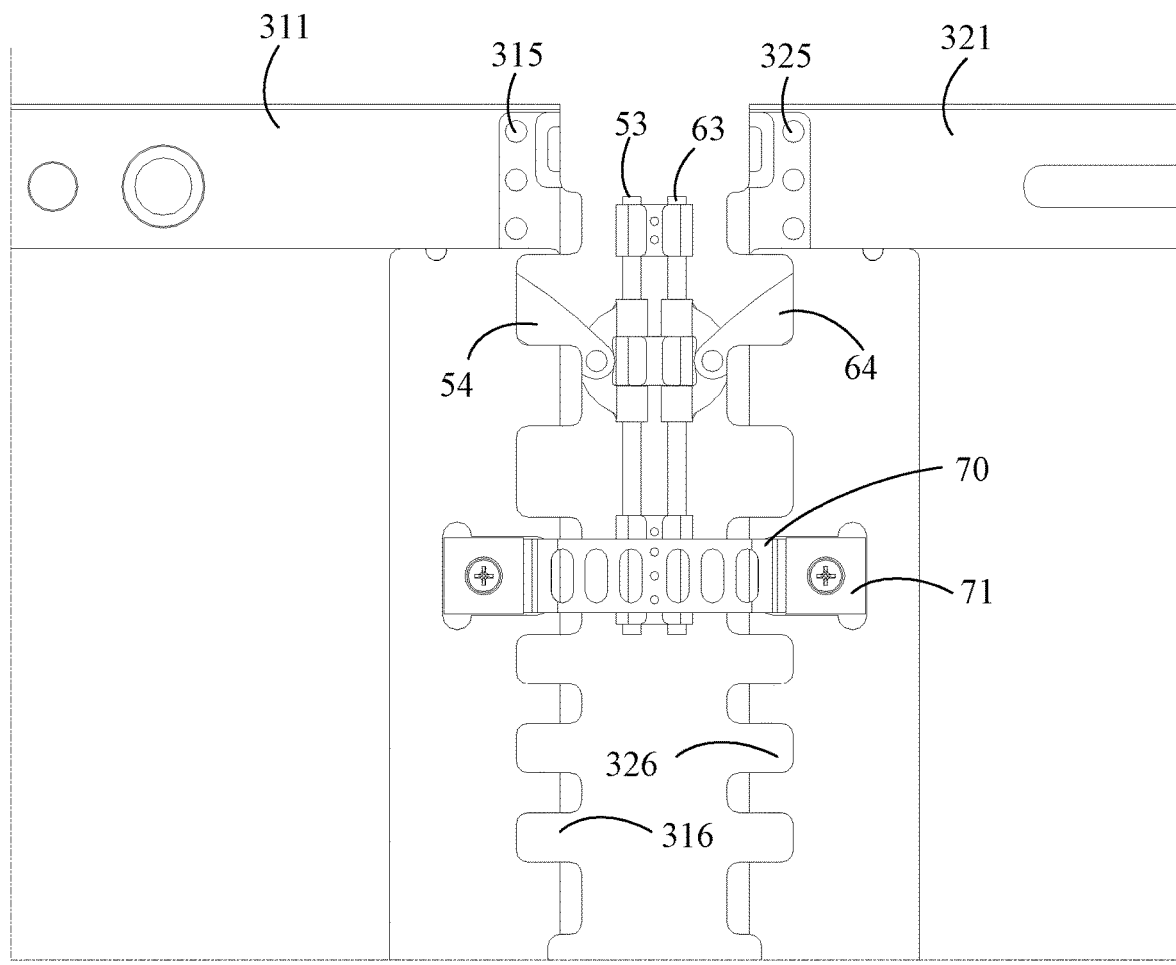
FIG. 14 is a schematic view of the structure shown in FIG. 11 with some elements of the foldable mechanism omitted.

As shown in FIG. 11, FIG. 13, and FIG. 14, the first front shell 311 may include a first mating portion 315, and the second front shell 321 may include a second mating portion 325. Each of the first decoration component 72a and the second decoration component 72b may be engaged with both the first mating portion 315 of the first front shell 311 and the second mating portion 325 of the second front shell 321. Each of the first decoration component 72a and the second decoration component 72b may be disposed at the corresponding end of the first sliding plate 51 and the second sliding plate 61 along the direction parallel to the Z-axis.

Figure 17:
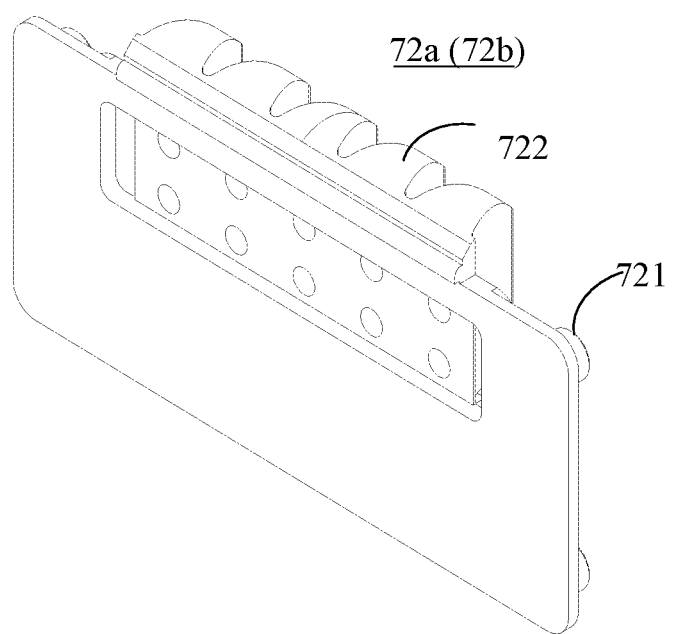
FIG. 17 is a perspective view of a first decoration component or a second decoration component.
Figure 18:
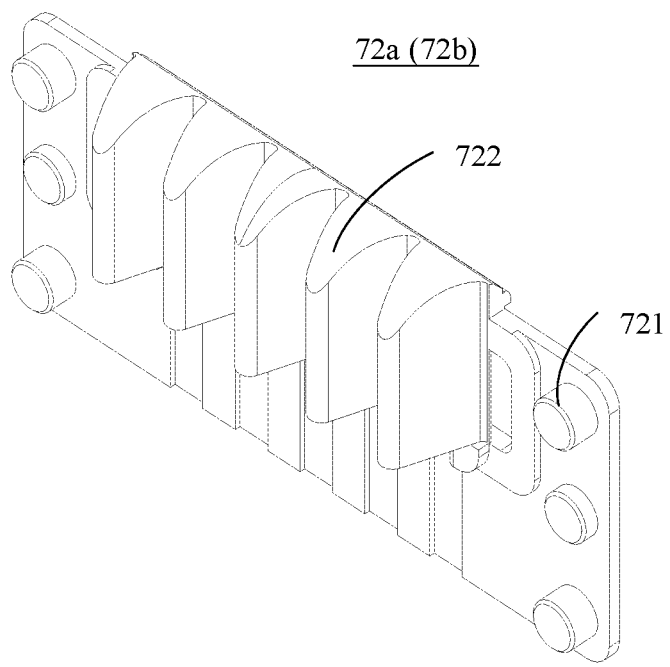
FIG. 18 is a perspective view of the first decoration component or the second decoration component, but shown from a different aspect.

As shown in FIG. 17 and FIG. 18, a surface of each of the first decoration component 72a and the second decoration component 72b facing towards the flexible display screen 10 may be substantially flat to allow an easy configuration of the flexible display screen 10. A connective structure, such as a protruding block 721, may be arranged on a surface of each of the first decoration component 72a and the second decoration component 72b facing away from the flexible display screen 10 and connected to the first front shell 311 and the second front shell 321. A plurality of ridges 722 may be further arranged on the surface of each of the first decoration component 72a and the second decoration component 72b facing away from the flexible display screen 10. When the foldable mobile terminal is in the unfolded state, each of the first decoration component 72a and the second decoration component 72b may be unfolded naturally. A distance between two adjacent ridges 722 may be gradually increased in a direction away from the flexible display screen 10. When each of the first decoration component 72a and the second decoration component 72b is bent, that is, when the foldable mobile terminal is in the folded state, the adjacent ridges 722 may contact with each other.

As shown in FIG. 10 and FIG. 11, the first shell 31 may have two or more first notches 316 spaced apart from each other. In some embodiments, as shown in FIG. 14 and FIG. 15, each of the two or more first notches 316 may be formed at a side of the first front shell 311 close to the first rotation assembly 50. Two or more first latches 511 may be configured on the first sliding plate 51 and correspond to the two or more first notches 316. When the foldable mobile terminal switches between the folded state and the unfolded state, the first sliding plate 51 may be received in the first shell 31 at varying levels. By configuring the latch on the first shell 31 and forming the notches in the first sliding plate 51 correspondingly, empty space between the first shell 31 and the first sliding plate 51 may be reduced, such that the flexible display screen 10 may be supported more stably and a possibility of the flexible display screen 10 having functional damages due to a local stress may be reduced.

Figure 6:
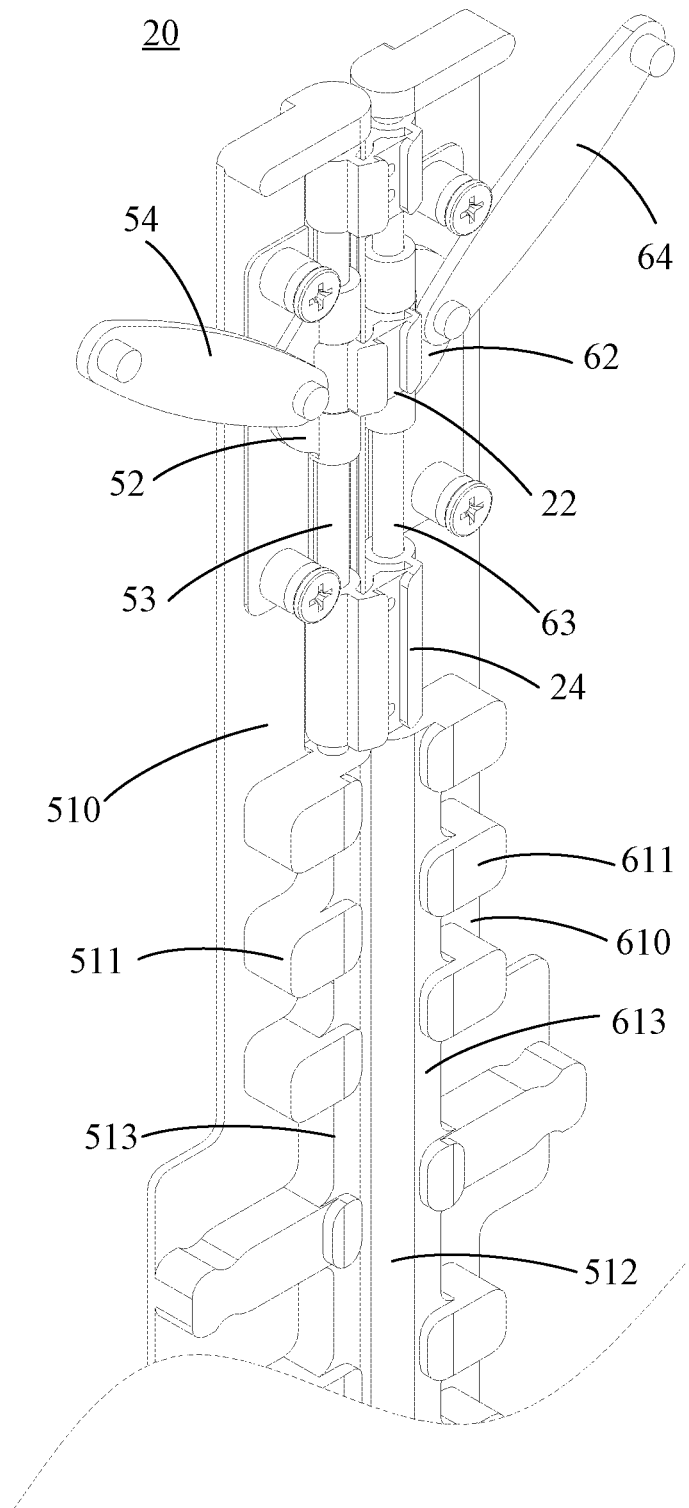
FIG. 6 is a perspective view of the foldable mechanism of FIG. 4 with portions omitted.

In some embodiments, as shown in FIG. 4 and FIG. 6, the first sliding plate 51 may include a first substrate 510, and the first latch 511 may be arranged on the first substrate 510. The first substrate 510 may be disposed between the first front shell 311 and the first back shell 312 and may slidably extend and retract between the first front shell 311 and the first back shell 312 (that is, slide away from or towards the first front shell 311). The first latch 511 and the first front shell 311 may be in a same plane. Herein, the plane may be parallel to a plane defined by the XZ-axes. The first latch 511 and the first front shell 311 may be configured to cooperatively support the flexible display screen 10.

It may be understood that another first notch may further be formed in the first sliding plate 51 between two adjacent first latches 511, and another first latch may further be arranged on the first front shell 311 between two adjacent first notches 316. The first latch 511 on the first sliding plate 51 may correspond to the first notch 316 on the first front shell 311, and the first notch on the first sliding plate 51 may correspond to the first latch arranged on the first front shell 311.

The second shell 32 may have two or more second notches 326 spaced apart from each other. In some embodiments, as shown in FIG. 14 and FIG. 15, each of the two or more second notches 326 may be formed at a side of the second front shell 321 close to the second rotation assembly 60. Two or more second latches 611 may be configured on the second sliding plate 61 and correspond to the two or more second notches 326. When the foldable mobile terminal switches between the folded state and the unfolded state, the second sliding plate 61 may be received in the second shell 32 at varying levels. By configuring the latch on the second shell 32 and forming the notches in the second sliding plate 61 correspondingly, empty space between the second shell 32 and the second sliding plate 61 may be reduced, such that the flexible display screen 10 may be supported more stably and a possibility of the flexible display screen 10 having functional damages due to a local stress may be reduced.

In some embodiments, as shown in FIG. 4 and FIG. 6, the second sliding plate 61 may include a second substrate 610, and the second latch 611 may be arranged on the second substrate 610. The second substrate 610 may be disposed between the second front shell 321 and the second back shell 322 and may slidably extend and retract (that is, slide away from or towards the second front shell 321) between the second front shell 321 and the second back shell 322. The second latch 611 and the second front shell 321 may be in a same plane parallel to a plane defined by the XZ-axes. The second latch 611 and the second front shell 321 may be configured to cooperatively support the flexible display screen 10.

It may be understood that another second notch may further be formed in the second sliding plate 61 between two adjacent second latches 611, and another second latch may further be arranged on the second front shell 321 between two adjacent second notches 326. The second latch 611 on the second sliding plate 61 may correspond to the second notch 326 on the second front shell 321, and the second notch on the second sliding plate 61 may correspond to the second latch arranged on the second front shell 321.

As shown in FIG. 4, a gap 512 may be formed between the first latch 511 on the first sliding plate 51 and the second latch 611 of the second sliding plate 61. At least partial structure of the supportive strip 26 may be received in the gap 512.

As shown in FIG. 4 and FIG. 6, on the first sliding plate 51, an end of each of the first latches 511 away from the first shell 31 may be connected to each other to form a first supportive beam 513. On the second sliding plate 61, an end of each of the second latches 611 away from the second shell 32 may be connected to each other to form a second supportive beam 613. At least a partial structure of the supportive strip 26 may be disposed on the first supportive beam 513 and the second supportive beam 613.

As shown in FIG. 13, the foldable mobile terminal may further include a first roller 58 and a first spring 59. The first roller 58 and the first spring 59 may be disposed between the first rotation assembly 50 and the first shell 31. The first rotation assembly 50 may have a first groove 514. When the first rotation assembly 50 slidably extends and retracts with respect to (that is, slides away from or towards) the first shell 31, the first roller 58 may move into or out of the first groove 514, such that the user of the foldable mobile terminal may feel a standstill if the foldable mobile terminal is folded to an appropriate position. In some embodiments, it is possible that the first roller 58 may move into the first groove 514 when the first groove 514 slides away from the first shell 31, and move out of the first groove 514 when the first groove 514 slides towards the first shell 31. However, in some embodiments, it is also possible that the first roller 58 may move into the first groove 514 when the first groove 514 slides towards the first shell 31, and move out of the first groove 514 when the first groove 514 slides away from the first shell 31. In some embodiments, the first spring 59 may include at least one of a rubber spring, a gas spring, a lead spring, a spiral spring, a torsion rod spring, and the like. In some embodiments, a first elastic rubber may be provided to replace the first roller 58 and the first spring 59, the first elastic rubber may be disposed in the first groove 514 of the first rotation assembly 50 and abut against the first shell 31. The first elastic rubber may be elastically deformed to reduce mechanical shock generated during sliding of the first rotation assembly 50.

In some embodiments, the first roller 58 and the first spring 59 may be disposed between the first sliding plate 51 and the first back shell 312. In some other embodiments, the first roller 58 and the first spring 59 may be disposed between the first sliding plate 51 and the first front shell 311. According to some embodiments shown in FIG. 4 and FIG. 13, the first groove 514 may be formed in a side wall of the first latch 511 of the first sliding plate 51 and face towards an adjacent first latch 511 arranged on the first substrate 510.

As shown in FIG. 13 and FIG. 15, a side wall in the first notch 316 may be recessed inwardly away from a corresponding first latch 511 to form a first cavity 317. The first roller 58 and the first spring 59 may be received in the first cavity 317. The first spring 59 may abut against the first roller 58 to allow at least a part of the first roller 58 to be exposed to an outside of the first cavity 317, such that the first roller 58 may elastically abut against a side wall of the corresponding first latch 511.

Further, the first latch 511 which has the first groove 514 may extend towards the first shell 31 for a distance longer than any other first latch 511 extends towards the first shell 31, that is, a length for which the first latch 511 having the first groove 514 may extend towards the first shell 31 is greater than a length for which any other first latch 511 may extend towards the first shell 31.

In some embodiments, at least two sets of the first rollers 58 and the first springs 59 may be provided. Each of two opposing side walls of the first latch 511 may have the first groove 514 matching with the first roller 58. Correspondingly, two opposing side walls of the first notch 316 may be recessed away from the corresponding first latch 511 to form two first cavities 317. Each of the two first cavities 317 may be formed to receive one set of the first roller 58 and the first spring 59.

In some embodiments, the side wall of the first latch 511 may have two first grooves 514 at two terminating positions corresponding to the first sliding plate 51. For example, one of the terminating positions may be located at an end of the first latch 511 close to the first shell 31, and the other one of the terminating positions may be located at an intersection between the first latch 511 and the first supportive beam 513. When the foldable mobile terminal is in the folded state and the unfolded state, the first roller 58 may respectively enter the first groove 514 of the corresponding one of the two terminating positions. Therefore, the user of the foldable mobile terminal may feel a standstill if the foldable mobile terminal is folded or unfolded to an appropriate position.

The foldable mobile terminal may further include a second roller 68 and a second spring 69. The second roller 68 and the second spring 69 may be disposed between the second rotation assembly 60 and the second shell 32. The second rotation assembly 60 may have a second groove 614. When the second rotation assembly 60 slidably extends and retracts with respect to (that is, slides away from or towards) the second shell 32, the second roller 68 may move into or out of the second groove 614, such that the user of the foldable mobile terminal may feel a standstill if the foldable mobile terminal is folded to an appropriate position. In some embodiments, the second spring 69 may include at least one of a rubber spring, a gas spring, a lead spring, a spiral spring, a torsion rod spring, and the like. In some embodiments, a second elastic rubber may be provided to replace the second roller 68 and the second spring 69, the second elastic rubber may be disposed in the second groove 614 of the second rotation assembly 60 and abut against the second shell 32. The second elastic rubber may be elastically deformed to reduce mechanical shock generated during sliding of the second rotation assembly 60.

In some embodiments, the second roller 68 and the second spring 69 may be disposed between the second sliding plate 61 and the second back shell 322. In some other embodiments, the second roller 68 and the second spring 69 may be disposed between the second sliding plate 61 and the second front shell 321. According to some embodiments shown in FIG. 4 and FIG. 13, the second groove 614 may be formed in a side wall of the second latch 611 of the second sliding plate 61, and face towards an adjacent second latch 611 arranged on the second substrate 610.

As shown in FIG. 13 and FIG. 15, a side wall in the second notch 326 may be recessed inwardly away from a corresponding second latch 611 to form a second cavity 327. The second roller 68 and the second spring 69 may be received in the second cavity 327. The second spring 69 may abut against the second roller 68 to allow at least a part of the second roller 68 to be exposed to an outside of the second cavity 327, such that the second roller 68 may elastically abut against a side wall of the corresponding second latch 611.

Further, the second latch 611 which has the second groove 614 may extend towards the second shell 32 for a distance longer than any other second latch 611 extending towards the second shell 32.

In some embodiments, at least two sets of the second rollers 68 and the second springs 69 may be provided. Each of two opposing side walls of the second latch 611 may have the second groove 614 matching with the second roller 68. Correspondingly, two opposing side walls of the second notch 326 may be recessed away from the corresponding second latch 611 to form two second cavities 327. Each of the two second cavities 327 may be formed to receive one set of the second roller 68 and the second spring 69.

In some embodiments, the side wall of the second latch 611 may have two second grooves 614 at two terminating positions corresponding to the second sliding plate 61. For example, one of the two terminating positions may be located at an end of the second latch 611 close to the second shell 32, and the other one of the two terminating positions may be located at an intersection between the second latch 611 and the second supportive beam 613. When the foldable mobile terminal is in the folded state and the unfolded state, the second roller 68 may respectively enter the second groove 614 of the corresponding one of the two terminating positions. Therefore, the user of the foldable mobile terminal may feel a standstill if the foldable mobile terminal is folded or unfolded to an appropriate position.

Technical features of the above-mentioned embodiments may be combined by any means. To provide a concise description, not all of the possible combinations of the technical features are described herein. However, as long as no contradiction is generated, any combination of the technical features should be within the scope of the present disclosure.

The above mentioned embodiments may illustrate only some implementations of the present disclosure. The description may be quite specific and detailed, but should not be considered to limit the scope of the present disclosure. It should be noted that, any ordinary skilled in the art, without departing from the concept of the present disclosure, may perform various transformation and improvement which should be within the scope of the present disclosure. Therefore, the scope of the present disclosure shall be subject to the claims.

What is claimed is:

1. A foldable mobile terminal, comprising:
   a flexible display screen;
   a shell assembly, comprising a first shell and a second shell, wherein the flexible display screen is arranged on the first shell and the second shell;
   a first rotation assembly, comprising:
      a first sliding plate, at least partially received in the first shell and able to slide towards or away from the first shell, wherein a side of the first shell facing the first sliding plate is recessed away from the first sliding plate to define two or more first notches, wherein the two or more first notches are spaced apart from each other, wherein two or more first latches are arranged on the first sliding plate and correspond to the two or more first notches, wherein the two or more first latches are received in the two or more first notches, wherein ends of the two or more first latches away from the first shell are connected to each other to form a first supportive beam, wherein ends of the two or more second latches away from the second shell are connected to each other to form a second supportive beam, wherein the first sliding plate comprises a first substrate, and wherein the two or more first latches are arranged on the first substrate;
a supportive strip, at least partially disposed on the first supportive beam and the second supportive beam;
a first rotation shaft, arranged on the first sliding plate; and
a first connection rod, wherein a first end of the first connection rod is slidably hinged to the first rotation shaft, and a second end of the first connection rod is rotatably connected to the first shell;
a second rotation assembly, comprising:
a second sliding plate, at least partially received in the second shell and able to slide towards or away from the second shell, wherein the second shell has two or more second notches spaced apart from each other, wherein the second sliding plate is arranged with two or more second latches, wherein the two or more second latches correspond to the two or more second notches, wherein the second sliding plate comprises a second substrate, and wherein the two or more second latches are arranged on the second substrate;
a second rotation shaft, arranged on the second sliding plate; and
a second connection rod, wherein a first end of the second connection rod is slidably hinged to the second rotation shaft, and a second end of the second connection rod is rotatably connected to the second shell; and
a gap formed between the two or more first latches and the two or more second latches, wherein at least a part of the supportive strip is received in the gap.

2. The foldable mobile terminal according to claim 1, wherein
the first shell comprises a first front shell and a first back shell engaged with each other;
the second shell comprises a second front shell and a second back shell engaged with each other;
the flexible display screen is arranged on the first front shell and the second front shell;
the two or more first notches are formed on the first front shell, the two or more second notches are formed on the second front shell; and
the first substrate is arranged between the first front shell and the first back shell, and the second substrate is arranged between the second front shell and the second back shell.

3. The foldable mobile terminal according to claim 2, further comprising a first pressing sheet, wherein the first pressing sheet is connected to the first front shell, and the first pressing sheet is configured to limit the first connection rod to be disposed between the first pressing sheet and the first front shell.

4. The foldable mobile terminal according to claim 2, further comprising a second pressing sheet, wherein the second pressing sheet is connected to the second front shell, and the second pressing sheet is configured to limit the second connection rod to be disposed between the second pressing sheet and the second front shell.

5. The foldable mobile terminal according to claim 1, wherein
the first rotation assembly further comprises a first sliding member, the first sliding member slidably sleeves on the first rotation shaft, and the first end of the first connection rod is rotatably connected to the first sliding member; and
the second rotation assembly further comprises a second sliding member, the second sliding member slidably sleeves on the second rotation shaft, and the first end of the second connection rod is rotatably connected to the second sliding member.

6. The foldable mobile terminal according to claim 5, wherein
the first rotation assembly further comprises a first support, and the second rotation assembly further comprises a second support, wherein
the first support is fixedly connected to the first sliding plate, the first rotation shaft is arranged to extend through the first support, and the first sliding member is arranged between the first support and the first sliding plate; and
the second support is fixedly connected to the second sliding plate, the second rotation shaft is arranged to extend through the second support, and the second sliding member is arranged between the second support and the second sliding plate.

7. The foldable mobile terminal according to claim 5, further comprising a linkage element moving jointly with the first and the second sliding members, wherein the linkage element has a first through hole and a second through hole, the first rotation shaft is arranged to extend through the first through hole, and the second rotation shaft is arranged to extend through the second through hole.

8. A foldable mechanism for a foldable mobile terminal, the foldable mobile terminal comprising a first shell and a second shell connected to each other, the foldable mechanism comprising:
a first rotation assembly, comprising:
a first sliding plate, capable of being at least partially received in the first shell and able to slide towards or away from the first shell, wherein a side of the first shell facing the first sliding plate is capable of being recessed away from the first sliding plate to define two or more first notches, wherein the two or more first notches are spaced apart from each other, wherein two or more first latches are arranged on the first sliding plate and correspond to two or more first notches, wherein the two or more first latches are capable of being received in the two or more first notches, wherein the two or more first latches are capable of being received in the two or more first notches, wherein ends of the two or more first latches away from the first shell are connected to each other to form a first supportive beam, wherein ends of the two or more second latches away from the second shell are connected to each other to form a second supportive beam, wherein the first sliding plate comprises a first substrate, the two or more first latches are arranged on the first substrate;
a supportive strip, at least partially disposed on the first supportive beam and the second supportive beam;
a first rotation shaft, arranged on the first sliding plate; and a first connection rod, wherein a first end of the first connection rod is slidably hinged to the first rotation shaft, and a second end of the first connection rod is capable of being rotatably connected to the first shell;

a second rotation assembly, comprising:

a second sliding plate, capable of being at least partially received in the second shell and able to slide towards or away from the second shell, wherein the second shell has two or more second notches spaced apart from each other, wherein the second sliding plate is arranged with two or more second latches, wherein the two or more second latches are capable of being arranged to correspond to the two or more second notches, wherein the second sliding plate comprises a second substrate, and wherein the two or more second latches are arranged on the second substrate;

a second rotation shaft, arranged on the second sliding plate; and a second connection rod, wherein a first end of the second connection rod is slidably hinged to the second rotation shaft, and a second end of the second connection rod is capable of being rotatably connected to the second shell; and a gap formed between the two or more first latches and the two or more second latches, wherein at least a part of the supportive strip is received in the gap.

9. The foldable mechanism for the foldable mobile terminal according to claim 8, wherein the first shell comprises a first front shell and a first back shell engaged with each other;

the second shell comprises a second front shell and a second back shell engaged with each other;

a flexible display screen is capable of being arranged on the first front shell and the second front shell;

the two or more first notches are formed on the first front shell, the two or more second notches are formed on the second front shell; and the first substrate is capable of being arranged between the first front shell and the first back shell, and the second substrate is capable of being arranged between the second front shell and the second back shell.

10. The foldable mechanism for the foldable mobile terminal according to claim 8, wherein a gap is formed between the two or more first latches and the two or more second latches, and at least a part of the supportive strip is received in the gap.

11. A foldable unit for a foldable mobile terminal, comprising:

a first shell and a second shell, wherein the first shell has two or more first notches spaced apart from each other; and a foldable mechanism, connected to the first shell and the second shell, and comprising:

a first sliding plate, at least partially received in the first shell and able to slide towards or away from the first shell, wherein a side of the first shell facing the first sliding plate is recessed away from the first sliding plate to define two or more first notches, wherein the two or more first notches are spaced apart from each other, wherein two or more first latches are arranged on the first sliding plate and correspond to the two or more first notches, wherein the two or more first latches are received in the two or more first notches, and wherein the first sliding plate comprises a first substrate, the two or more first latches are arranged on the first substrate;

a first rotation shaft, arranged on the first sliding plate;

a first connection rod, wherein a first end of the first connection rod is slidably hinged to the first rotation shaft, and a second end of the first connection rod is rotatably connected to the first shell;

a first sliding member, slidably sleeved on the first rotation shaft and rotatably connected to the first end of the first connection rod;

a first support, fixedly connected to the first sliding plate, wherein the first rotation shaft is arranged to extend through the first support, and wherein the first sliding member is arranged between the first support and the first sliding plate;

a second sliding plate, at least partially received in the second shell and able to slide towards or away from the second shell, wherein the second shell has two or more second notches spaced apart from each other, wherein the second sliding plate is arranged with two or more second latches, wherein the two or more second latches are capable of being arranged to correspond to the two or more second notches, wherein the second sliding plate comprises a second substrate, and the two or more second latches are arranged on the second substrate;

a second rotation shaft, arranged on the second sliding plate;

a second connection rod, wherein a first end of the second connection rod is slidably hinged to the second rotation shaft, and a second end of the second connection rod is rotatably connected to the second shell;

a second sliding member, slidably sleeves on the second rotation shaft and rotatably connected to the first end of the second connection rod;

a second support, fixedly connected to the second sliding plate, wherein the second rotation shaft is arranged to extend through the second support, and wherein the second sliding member is arranged between the second support and the second sliding plate; and a gap formed between the two or more first latches and the two or more second latches, wherein at least a part of the supportive strip is received in the gap.

12. The foldable unit for the foldable mobile terminal according to claim 11, wherein the first sliding plate comprises a first substrate, the two or more first latches are arranged on the first substrate; and the second sliding plate comprises a second substrate, and the two or more second latches are arranged on the second substrate.

\* \* \* \* \*